United States Patent
Nanda et al.

(10) Patent No.: US 6,871,207 B1
(45) Date of Patent: Mar. 22, 2005

(54) TECHNIQUES FOR SPREADING ZEROS IN A DIGITAL FILTER WITH MINIMAL USE OF REGISTERS

(75) Inventors: Kartik Nanda, Nashua, NH (US); Dan Kasha, Providence, RI (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/466,835

(22) Filed: Dec. 20, 1999

(51) Int. Cl.[7] ............................................. G06F 17/17
(52) U.S. Cl. ...................................................... 708/313
(58) Field of Search ......................................... 708/313

(56) References Cited

U.S. PATENT DOCUMENTS 5,262,970 A  * 11/1993  Sevenhans et al. ......... 708/313
6,161,118 A  * 12/2000  Lu .............................. 708/313
6,317,765 B1 * 11/2001  Page et al. .................. 708/313
6,321,246 B1 * 11/2001  Page et al. .................. 708/316
6,408,318 B1 *  6/2002  Fang et al. .................. 708/313
6,470,365 B1 * 10/2002  Rahman et al. ............. 708/313

OTHER PUBLICATIONS

"An Economical Class of Digital Filters for Decimation and Interpolation", by Eugene Hogenauer, IEEE Transactions on Acoustics, Speech, and Signal Processing, vol. ASSP–29, No. 2, Apr. 1981.

* cited by examiner

Primary Examiner—Tan V. Mai
(74) Attorney, Agent, or Firm—Steven Lin, Esq.

(57) ABSTRACT

Techniques related to a digital filter include at least one decimator disposed between an integrator section and a comb section such that the transfer function of the filter has split zeros. The resulting filter implementation employs considerable less silicon real estate than other prior art implementations with spread zeros, and has more design flexibility with improved resulting performance than the Hogenauer implementation.

15 Claims, 18 Drawing Sheets

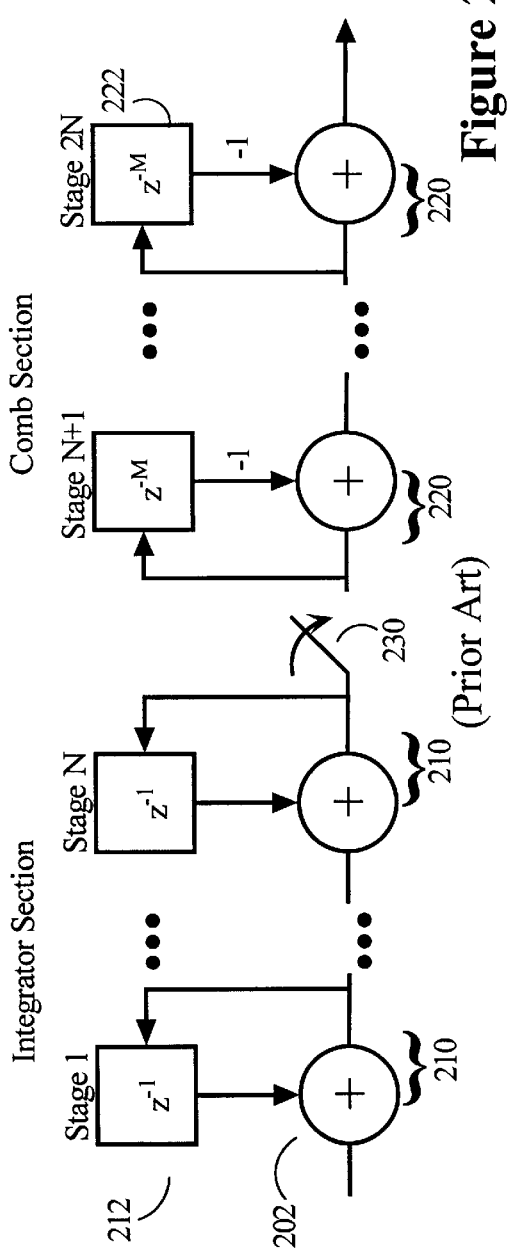
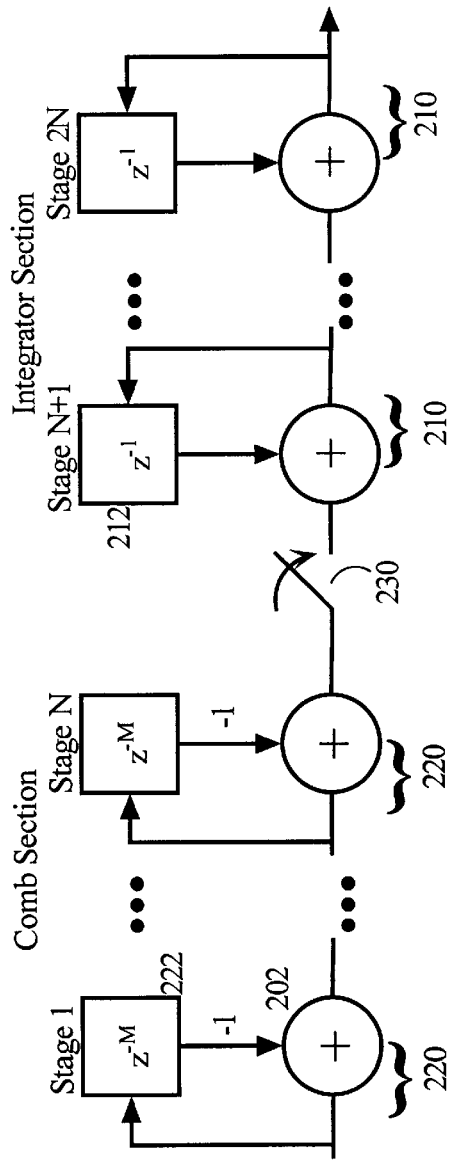
Figure 2A (Prior Art)
Figure 2B (Prior Art)

| Time | Input | Output from I^3 | C1 | C2 | C3 | Output |
|---|---|---|---|---|---|---|
| 0 | 0 | 0 | 0 | 0 | 0 | 0 |
| 1 | 1 | 1 | 1 | 1 | 1 | |
| 2 | 0 | 3 | 3 | 3 | 3 | |
| 3 | 0 | 6 | 6 | 6 | 6 | |
| 4 | 0 | 10 | 10 | 10 | 10 | |
| 5 | 0 | 15 | 15 | 15 | 15 | |
| 6 | 0 | 21 | 21 | 21 | 21 | |
| 7 | 0 | 28 | 28 | 28 | 28 | |
| 8 | 0 | 36 | 36 | 36 | 36 | |
| 9 | 0 | 45 | 45 | 45 | 45 | |
| 10 | 0 | 55 | 55 | 55 | 55 | |
| 11 | 0 | 66 | 66 | 66 | 66 | |
| 12 | 0 | 78 | 78 | 78 | 78 | |
| 13 | 0 | 91 | 91 | 91 | 91 | |
| 14 | 0 | 105 | 105 | 105 | 105 | |
| 15 | 0 | 120 | 120 | 120 | 120 | |
| 16 | 0 | 136 | 136 | 136 | 136 | 136 |
| 17 | 0 | 153 | 152 | 151 | 150 | |
| 18 | 0 | 171 | 168 | 165 | 162 | |
| 19 | 0 | 190 | 184 | 178 | 172 | |
| 20 | 0 | 210 | 200 | 190 | 180 | |
| 21 | 0 | 231 | 216 | 201 | 186 | |
| 22 | 0 | 253 | 232 | 211 | 190 | |
| 23 | 0 | 276 | 248 | 220 | 192 | |
| 24 | 0 | 300 | 264 | 228 | 192 | |
| 25 | 0 | 325 | 280 | 235 | 190 | |
| 26 | 0 | 351 | 296 | 241 | 186 | |
| 27 | 0 | 378 | 312 | 246 | 180 | |
| 28 | 0 | 406 | 328 | 250 | 172 | |
| 29 | 0 | 435 | 344 | 253 | 162 | |
| 30 | 0 | 465 | 360 | 255 | 150 | |
| 31 | 0 | 496 | 376 | 256 | 136 | |
| 32 | 0 | 528 | 392 | 256 | 120 | 120 |
| 33 | 0 | 561 | 408 | 256 | 105 | |
| 34 | 0 | 595 | 424 | 256 | 91 | |
| 35 | 0 | 630 | 440 | 256 | 78 | |
| 36 | 0 | 666 | 456 | 256 | 66 | |
| 37 | 0 | 703 | 472 | 256 | 55 | |
| 38 | 0 | 741 | 488 | 256 | 45 | |
| 39 | 0 | 780 | 504 | 256 | 36 | |
| 40 | 0 | 820 | 520 | 256 | 28 | |
| 41 | 0 | 861 | 536 | 256 | 21 | |
| 42 | 0 | 903 | 552 | 256 | 15 | |
| 43 | 0 | 946 | 568 | 256 | 10 | |
| 44 | 0 | 990 | 584 | 256 | 6 | |
| 45 | 0 | 1035 | 600 | 256 | 3 | |
| 46 | 0 | 1081 | 616 | 256 | 1 | |
| 47 | 0 | 1128 | 632 | 256 | 0 | |
| 48 | 0 | 1176 | 648 | 256 | 0 | 0 |

Figure 7A

| Time | Input | Output from I^3 | C1 | C2 | C3 | Output |
|---|---|---|---|---|---|---|
| 0 | 0 | 0 | 0 | 0 | 0 | 0 |
| 1 | 1 | 1 | 1 | 1 | 1 | |
| 2 | 0 | 3 | 3 | 3 | 3 | |
| 3 | 0 | 6 | 6 | 6 | 6 | |
| 4 | 0 | 10 | 10 | 10 | 10 | |
| 5 | 0 | 15 | 15 | 15 | 15 | |
| 6 | 0 | 21 | 21 | 21 | 21 | |
| 7 | 0 | 28 | 28 | 28 | 28 | |
| 8 | 0 | 36 | 36 | 36 | 36 | |
| 9 | 0 | 45 | 45 | 45 | 45 | |
| 10 | 0 | 55 | 55 | 55 | 55 | |
| 11 | 0 | 66 | 66 | 66 | 66 | |
| 12 | 0 | 78 | 78 | 78 | 78 | |
| 13 | 0 | 91 | 91 | 91 | 91 | |
| 14 | 0 | 105 | 105 | 105 | 105 | |
| 15 | 0 | 120 | 120 | 119 | 120 | |
| 16 | 0 | 136 | 136 | 133 | 133 | 133 |
| 17 | 0 | 153 | 153 | 147 | 146 | |
| 18 | 0 | 171 | 171 | 161 | 158 | |
| 19 | 0 | 190 | 189 | 174 | 168 | |
| 20 | 0 | 210 | 207 | 186 | 176 | |
| 21 | 0 | 231 | 225 | 197 | 182 | |
| 22 | 0 | 253 | 243 | 207 | 186 | |
| 23 | 0 | 276 | 261 | 216 | 188 | |
| 24 | 0 | 300 | 279 | 224 | 188 | |
| 25 | 0 | 325 | 297 | 231 | 186 | |
| 26 | 0 | 351 | 315 | 237 | 182 | |
| 27 | 0 | 378 | 333 | 242 | 176 | |
| 28 | 0 | 406 | 351 | 246 | 168 | |
| 29 | 0 | 435 | 369 | 249 | 158 | |
| 30 | 0 | 465 | 387 | 251 | 146 | |
| 31 | 0 | 496 | 405 | 252 | 133 | |
| 32 | 0 | 528 | 423 | 252 | 119 | 119 |
| 33 | 0 | 561 | 441 | 252 | 105 | |
| 34 | 0 | 595 | 459 | 252 | 91 | |
| 35 | 0 | 630 | 477 | 252 | 78 | |
| 36 | 0 | 666 | 495 | 252 | 66 | |
| 37 | 0 | 703 | 513 | 252 | 55 | |
| 38 | 0 | 741 | 531 | 252 | 45 | |
| 39 | 0 | 780 | 549 | 252 | 36 | |
| 40 | 0 | 820 | 567 | 252 | 28 | |
| 41 | 0 | 861 | 585 | 252 | 21 | |
| 42 | 0 | 903 | 603 | 252 | 15 | |
| 43 | 0 | 946 | 621 | 252 | 10 | |
| 44 | 0 | 990 | 639 | 252 | 6 | |
| 45 | 0 | 1035 | 657 | 252 | 3 | |
| 46 | 0 | 1081 | 675 | 252 | 1 | |
| 47 | 0 | 1128 | 693 | 252 | 0 | |
| 48 | 0 | 1176 | 711 | 252 | 0 | 0 |

Figure 7B

TECHNIQUES FOR SPREADING ZEROS IN A DIGITAL FILTER WITH MINIMAL USE OF REGISTERS

FIELD OF THE INVENTION

The invention relates to digital filters, and more particularly to flexibly positioning N zeros of a digital $Sinc^N$ filter with a minimal use of extra registers.

BACKGROUND OF THE INVENTION

Techniques for sampling an analog signal, converting the sampled signal to digital and processing that signal using digital techniques are known in the art. An example of an analog signal source is that provided by a measurement sensor, such as a thermocouple. The sampled analog signal is converted to digital. Conversion to digital may produce a digital stream of one or more bits. Typically, the analog signal is sampled at one rate, the sampling frequency ($f_S$), while the digital output is needed at a different rate, the output word rate (OWR).

Filters for doing such processing, such as finite impulse response (FIR) filters and FIR Sinc filters, are known. Digital filters such as Sinc filters can be implemented using digital circuits for performing a variety of mathematical operations. Some FIR filters use tables of coefficients for multiplying digital values and performing additions. Multipliers are known which use 2's complement addition to perform multiplication. However, such multipliers require a fair amount of power, machine cycles and silicon real estate to implement.

Certain cascaded integrator comb (CIC) filters described in an article by Eugene B. Hogenauer, entitled "AN ECONOMICAL CLASS OF DIGITAL FILTERS FOR DECIMATION AND INTERPOLATION," published in IEEE Transactions on Acoustics, Speech and Signal Processing, Volume ASSP-29, No. 2, Apr. 1981, incorporated herein in its entirety by reference (Hogenauer filter), perform the filtering without coefficient multiplication. N integrators, N combs and a subsampling switch comprise an Nth order Hogenauer Sinc filter denoted by $Sinc^N$. The N integrators operate at a high sampling rate, $f_S$, and the N combs operate at a low sampling rate (the subsampling rate) $f_{SS}$.

The frequency response of a Hogenauer filter depends on the order N of the Sinc filter, a differential delay M, and the integer rate change factor R. The Hogenauer filters produce a frequency response characterized by an equation or a polynomial expression of the equation with roots (also called "zeros") where attenuation of signals is very strong. R, M, and N are chosen to provide acceptable passband characteristics over the frequency range from zero to a predetermined cutoff frequency, $f_C$, expressed relative to the low sampling rate $f_{SS}$.

The Hogenauer article, cited above, notes some problems encountered with these filters. One disadvantage is that the frequency response is fully determined by only three integer parameters, resulting in a limited range of filter characteristics. For example, the Hogenauer filter of order N always superimposes all zeros at a frequency $f_0$ (and integral multiples of $f_0$) where $f_0$ is defined as:

$$f_0 = \frac{1}{M} \cdot f_{ss}$$

This wastes the potential to strongly attenuate other frequencies in the vicinity of the frequency $f_0$.

What is needed are techniques that enable greater freedom in the placement of zeros than allowed by Hogenauer filters, and techniques to tailor the passband characteristics as described without employing the multipliers and large number of registers that greatly increase the use of silicon real estate in other digital filters.

SUMMARY OF THE INVENTION

A new architecture for implementing $Sinc^N$ filters is introduced, based on the Hogenauer architecture, which permits arbitrary zero placement. Zero splitting is achieved by observing the data dependencies in the comb section of a baseline filter, and subsequently translating them into a new architecture that can be implemented in hardware with a small cost in chip size or implemented in software in a digital signal processor with small cost in computation. The architecture retains the inherent flexibility and conceptual simplicity of the Hogenauer $Sinc^N$ architecture. Since zero splitting generally requires additional sampling of integrator section output, the filter is usually somewhat larger than the corresponding Hogenauer filters without split zeros.

An advantage of the filters of the present invention is a considerable increase in the design options available to the filter designers. Splitting the zeros may also be used to reduce the noise that gets aliased back into the passband. Splitting the zeros also allows selective simultaneous attenuation of power line frequencies, such as 50 Hz and 60 Hz. Because of the large power associated with these line frequencies, they often cause introduction of "noise" into electronic equipment. Placing filter zeros at one or more of these frequencies can significantly reduce noise of the unwanted line frequency and increase the SNR of a device. Simultaneous rejection of both 50 Hz and 60 Hz by the same filter is desirable so that the same filter can be used in different regions of the world without changes. Similarly simultaneous attenuation of other frequencies is possible.

According to the invention, methods, products, systems and techniques related to the digital filter include at least one decimator disposed between an integrator section and a comb section such that the transfer function of the filter has split zeros. The resulting filter implementation employs considerable less silicon real estate than other prior art implementations with spread zeros, and has better SNR characteristics than the Hogenauer implementation.

BRIEF DESCRIPTION OF THE FIGURES

The present invention is illustrated by way of example, and not by way of limitation, in the figures of the accompanying drawings in which like reference numerals refer to similar elements and in which:

FIG. 2A is a block diagram of a prior art general purpose Hogenauer decimation filter.

FIG. 2B is a block diagram of a prior art general purpose Hogenauer interpolation filter.

FIGS. 7A and 7B are sample data dependency charts of the filters illustrated in FIGS. 6B and 6C with tracebacks generated using one embodiment of a process for designing digital filters according to the present invention.

DETAILED DESCRIPTION

A method and apparatus is described for spreading zeros from a Hogenauer $Sinc^N$ filter to flexibly control filter response without a large increase in the number of registers needed and the corresponding cost in silicon real estate. In the following description, for the purposes of explanation, numerous specific details are set forth in order to provide a thorough understanding of the present invention. It will be apparent, however, to one skilled in the art, that the present invention may be practiced without these specific details. In other instances, well-known structures and devices are shown in block diagram form in order to avoid unnecessarily obscuring the present invention.

Digital filters play an important role in many applications. For example, in analog to digital conversion (ADC), analog signals are converted to digital data streams at some high sampling rate $f_S$ and digital values are output as words at an output word rate (OWR). The OWR may be the same as, greater than, or less than the sampling rate $f_S$.

Figure 1:
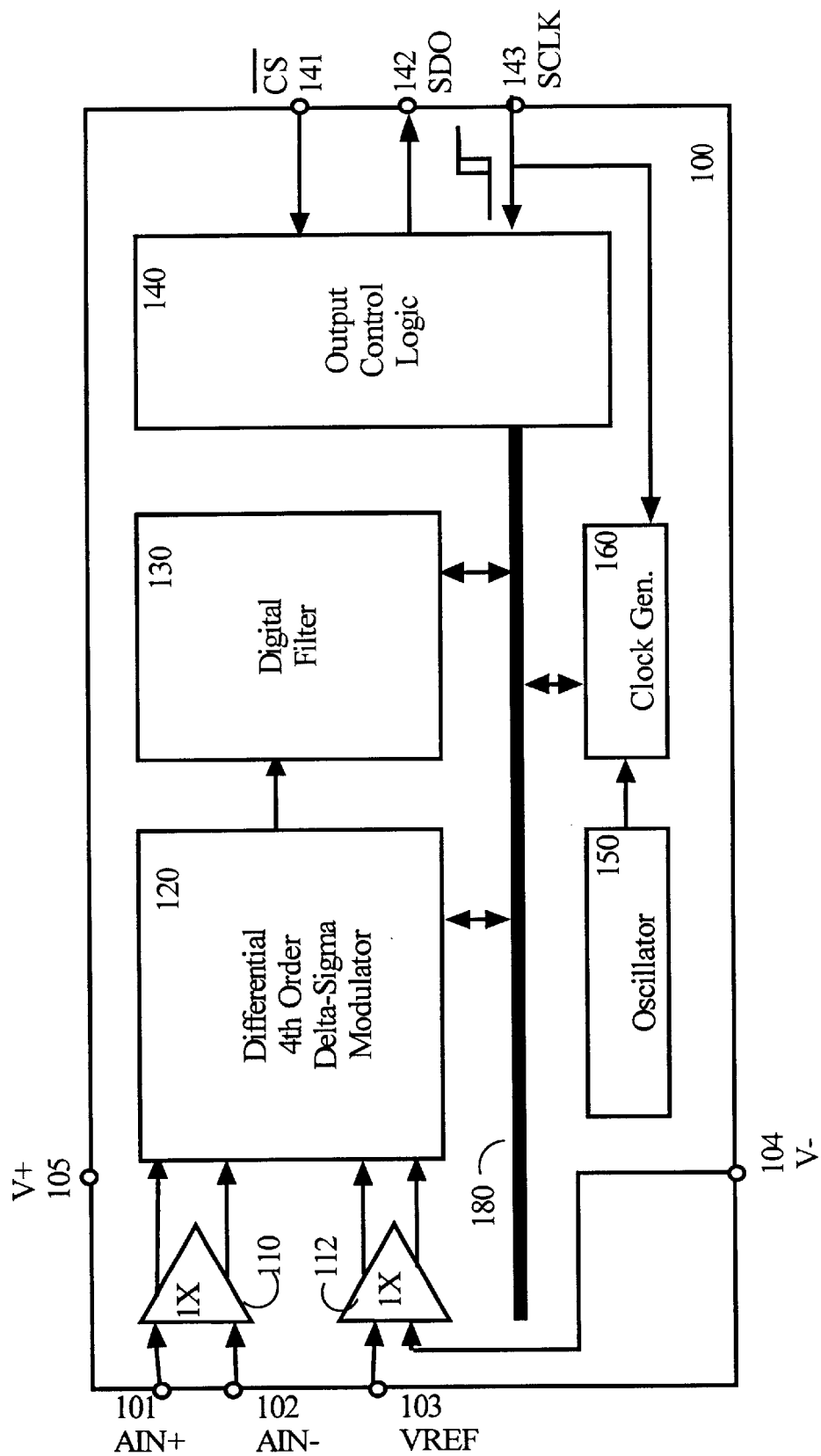
FIG. 1 is a block diagram of an exemplary analog to digital conversion (ADC) chip which employs a digital filter according to one embodiment of the present invention.

FIG. 1 depicts an exemplary ADC chip 100 which uses digital filters. This one is manufactured by Crystal™ Semiconductor, a Division of Cirrus Logic Corporation, and is identified as part number CS5510. The sample ADC chip 100 includes a communications bus 180 through which the other components of the chip communicate. An analog signal is input at the AIN+ and AIN− terminals 101 and 102, respectively. A reference voltage is input at VREF terminal 103, and power to the chip is provided at either or both of the V+ and V− leads, 105 and 104, respectively. After preconditioning in items 110 and 112, the analog and reference signals are input into a differential fourth-order delta-sigma modulator 120, which outputs a digital bit stream at the sampling rate $f_S$. A digital filter 130 constructs output words with high resolution from the bit stream. For the exemplary ADC chip 100, the design specification requires attenuating certain frequencies by at least 80 deciBels (dB). The words produced by the digital filter are communicated to the output control logic processor 140 which sends the words out to a user through the SDO terminal 142 in response to a control signal at the $\overline{CS}$ terminal 141 and a serial clock signal at the serial clock 143 terminal. A clock generator 160 provides clock pulses to the bus in response to either an oscillator 150 or the serial clock signal coming in on the clock lead 143, or both.

A variety of designs can be used for the digital filter 130. Many are well known in the art. Some filters use coefficients and multipliers to achieve the desired frequency response. The Hogenauer filters require no multipliers, and use limited storage thereby leading to more economical hardware implementations. They are designated cascaded integrators-comb (CIC) filters because their structure consists of an integrator section operating at a high rate and a comb section operating at a low rate.

FIG. 2A shows the basic structure of Hogenauer decimation filters. FIG. 2B shows a Hogenauer interpolation filter. For a digital filter of order N, the integrator section consists of N ideal digital integrator stages operating at the high sampling rate, $f_S$. Each stage is implemented with a one unit delay as a feedback 210. The transfer function for a single integrator is given by Equation 1.

$$H_1(z) = \frac{1}{1-z^{-1}} \quad (1)$$

where Equation 1 is the system function expressed in terms of the z transform well known in the art. The hardware elements of each integrator stage consists of an adder 202 and a one-time-step-delay element 212 in a feedback loop, indicated by the backwards pointing arrow, into a single-step delay element 212. The expression $z^{-1}$ is the z transform representation for a one-time-step delay; it may be implemented in hardware by a register recording the last value placed there. The comb section operates at the low sampling rate $f_{SS}$ of decimator 230, where $f_{SS}=f_S/R$, and R is the integer rate change factor. This section consists of N comb stages with a differential delay of M timesamples per stage, represented by the expression $z^{-M}$ in multiple delay element 222. In hardware a $z^{-M}$ delay element is often composed of M registers. The value of M can be kept small by the decimator 230 disposed between the integrator section and the comb section that allows the comb section to operate at the lower frequency. The $f_{SS}$ decimator 230 is represented by an open switch that is closed once per subsample interval. The transfer function for a single comb stage referenced to the high sampling rate is given in Equation 2.

$$H_C(z)=1-z^{-RM} \quad (2)$$

It follows from Equations 1 and 2 that the system transfer function for the composite filter referenced to the high sampling rate $f_S$, is given by Equation 3.

$$H(z) = H_I^N(z)H_C^N(z) = \left[\frac{(1-z^{-RM})}{(1-z^{-1})}\right]^N \quad (3)$$

It is implicit from the last form of this system function that the CIC filter is functionally equivalent to a cascade of N uniform FIR filter stages, each FIR filter stage with a transfer function of $(1-z^{-RM})/(1-z^{-1})$.

The structure for the CIC interpolation filter is presented in FIG. 2B. Here the N stage comb section precedes the N stage integrator section. In this interpolation case, the switch 230 causes a rate increase by a factor R by inserting R−1 zero value samples between consecutive samples of the comb section output.

Figure 2C:
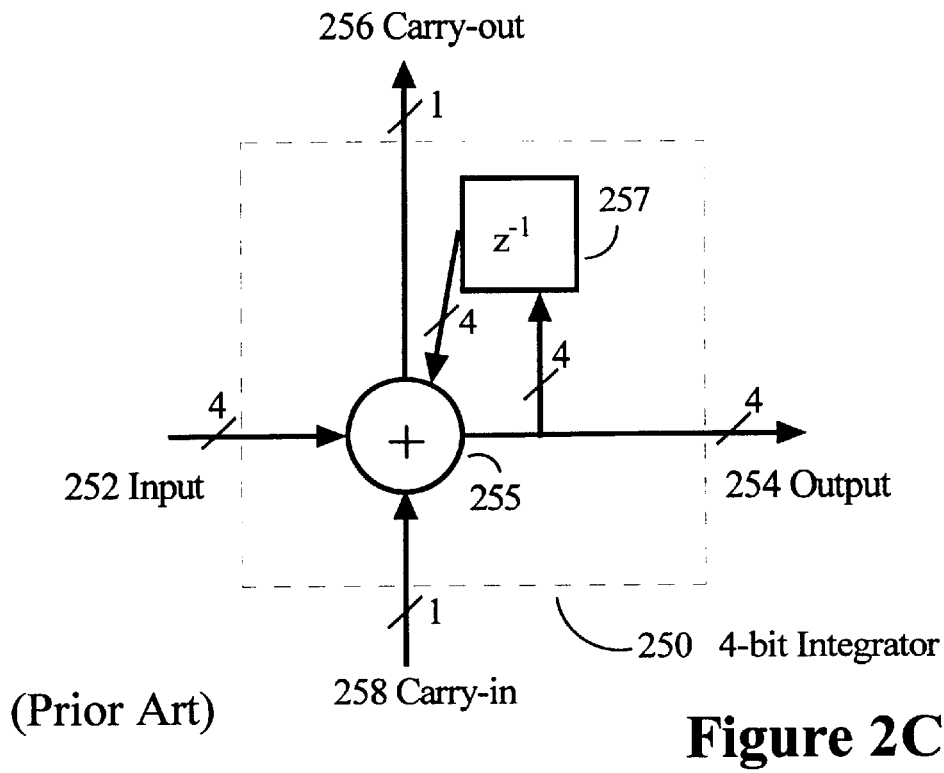
FIG. 2C is a block diagram of an integrator for a Hogenauer filter.
Figure 2D:
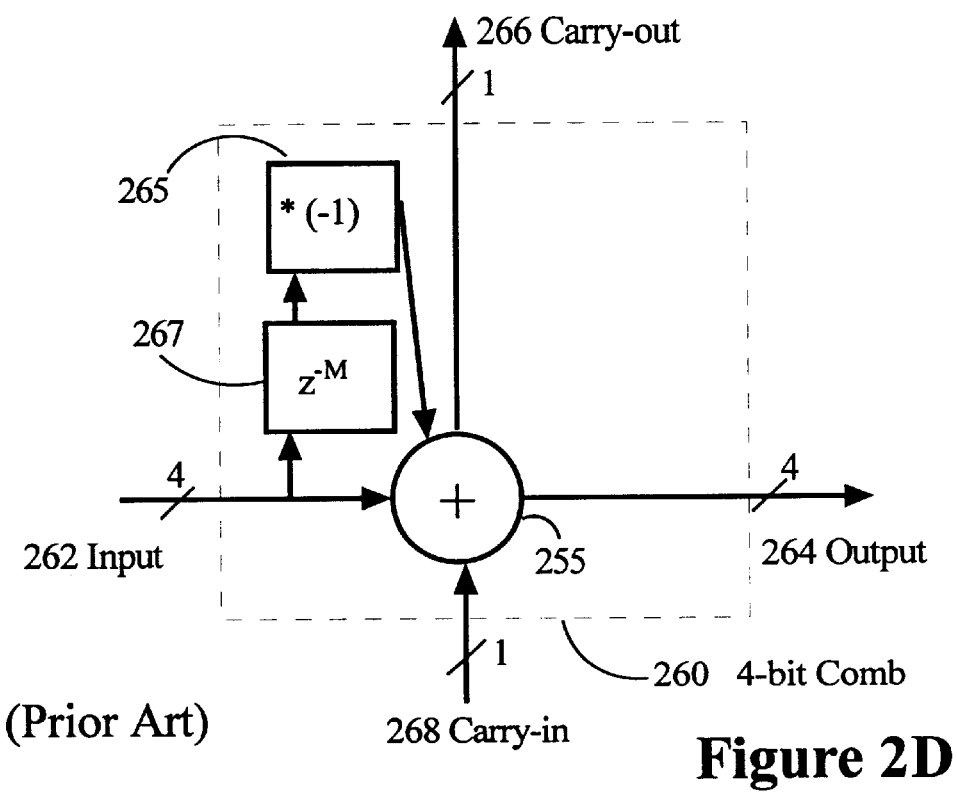
FIG. 2D is a block diagram of a prior art general purpose comb for a Hogenauer filter.

Hogenauer gives a hardware example of a filter using four-bit integrators and four-bit combs that uses twos complement arithmetic. The four-bit integrator is illustrated in FIG. 2C where a four-bit adder 255 handles a carry-in input 258, and produces a carry-out output 256, in addition to handling the four-bit input 252 and the four-bit output 254. The four-bit register 257 that provides the one time step delay is also shown in FIG. 2C. The four-bit comb is illustrated in FIGS. 2D and has a one-bit carry-in signal 268 as well as a one-bit carry-out signal 266, in addition to the four-bit input 262 and four-bit output 264. A four-bit M step delay element 267 is connected to a four-bit multiplication by −1 (implemented here as a multiply by −1 element 265) connected to the four-bit adder or summation element 255. The multiply by −1 element 265 causes subtraction to be effected in the comb stage.

The system response given by Equation 3 indicates that the values of frequency that produce a zero in the numerator, and therefore which provide maximum attenuation of input frequencies, are all N-order zeros. Placing multiple zeros at the same frequency concentrates the attenuation at that frequency and wastes the potential for zeroing out or strongly attenuating several other frequencies. In general, a polynomial of order N can have up to N different zeros. The Hogenauer filters do not provide a means for spreading or splitting out the potential N zeros of the system response. As will explained below, the present invention modifies the structure of the Hogenauer filters so that any or all zeros can be split and spread to other frequencies.

Hardware Overview

Figure 3A:
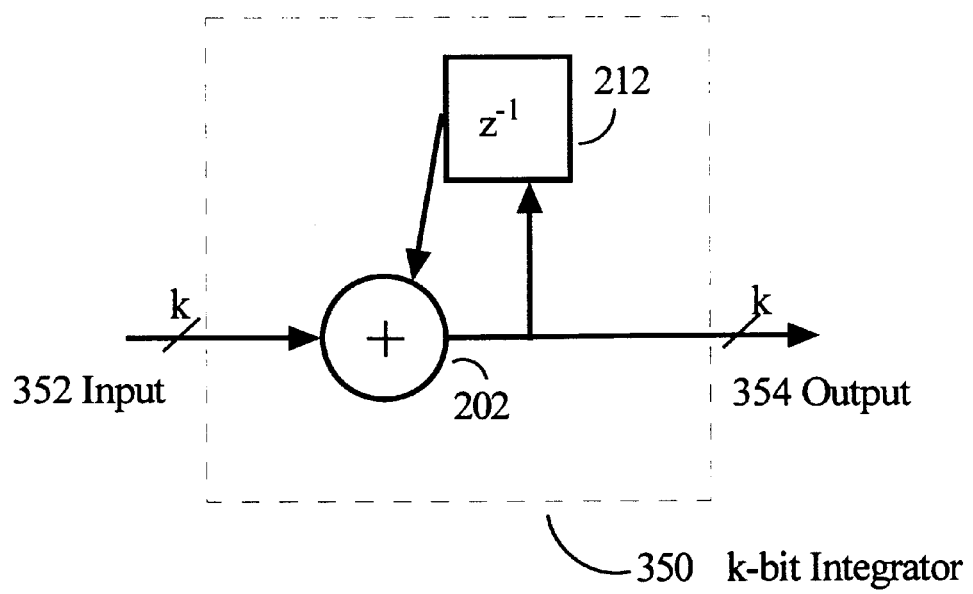
FIG. 3A is a block diagram of an integrator preferred according to one embodiment of the present invention.
Figure 3B:
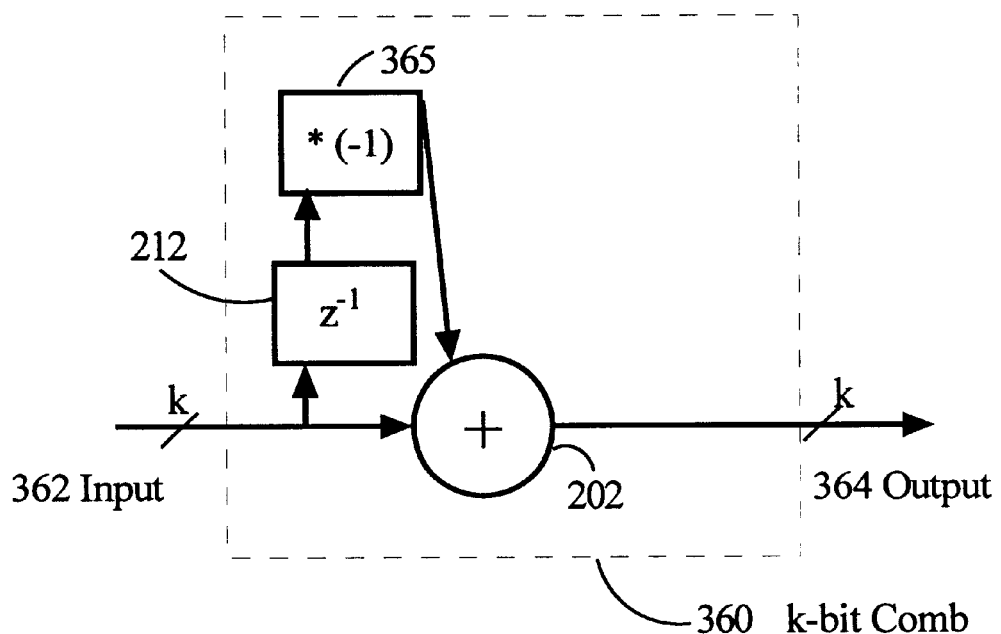
FIG. 3B is a block diagram of a comb preferred according to one embodiment of the present invention.

The integrator, decimators and combs used in the present invention can be implemented in any of the ways known in the art. For illustration purposes, the present invention will be described in terms of certain embodiments which are used by way of example and not by way of limitation. In the following, the basic elements of the filters utilizing the techniques of the present invention will be the k-bit integrator 350 illustrated in FIG. 3A, and the k-bit comb 360 illustrated in FIG. 3B. The value of k can vary depending on the application, for example, k may be 32. In the CS5510 chip, k is 29. As shown in FIG. 3A, the k-bit integrator 350 includes a k-bit adder 202 and a feedback loop with a one time step delay element 212. The input 352 consists of j;bitsbut the output is again k bits (where j may be equal to k or different from k). In the preferred embodiment of the k-bit comb 360, the time step delay element is the one time step delay element 212 followed by a one-bit multiply by −1 element 365 feeding forward into the summation element, adder 202. The comb k-bit input 362 and k-bit output 264 are all illustrated in FIG. 3B.

Figure 4:
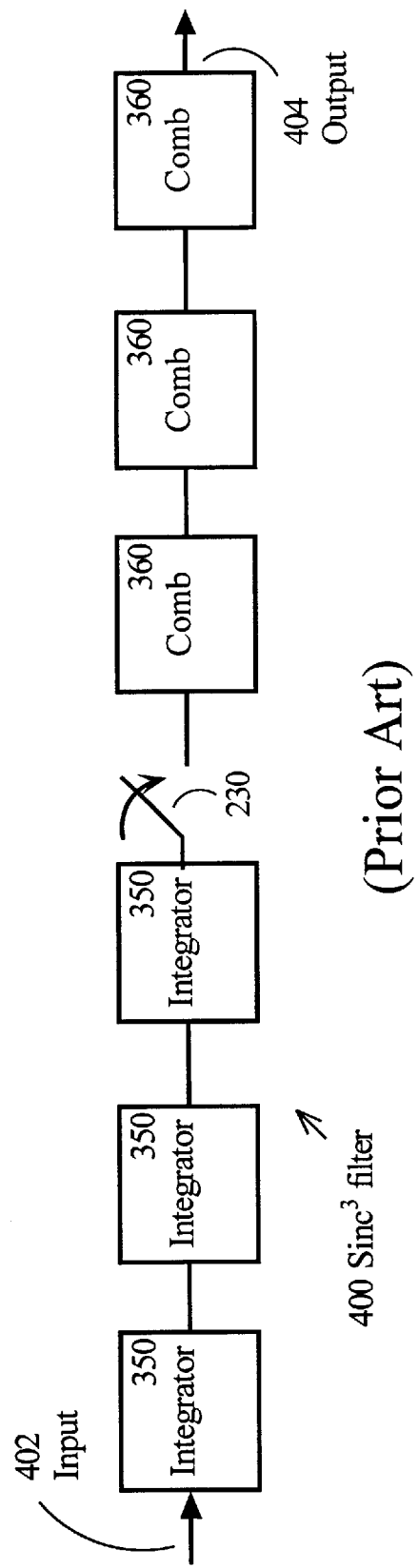
FIG. 4 is a block diagram of an exemplary Sinc³ Hogenauer filter using the integrator and comb elements of FIGS. 3A and 3B in accordance with the invention.

FIG. 4 illustrates an embodiment of a Hogenauer third-order filter 400 also called a Sinc³ filter, made up of the three stages of the integrator 350, the decimator 230, and the three stages of comb 360, leading to output 404. The decimator 230 closes at $f_{SS}$. For example, the sample ADC chip 100 of FIG. 1, has a high frequency sampling rate, $f_S$, of 8192 Hz, and supports only one OWR. In this example, R is 153, and decimator switch 230 will close on every 153$^{rd}$ cycle so that the comb stages 360 only operate at every 153$^{rd}$ cycle of the integrator stages 350. The Sinc³ filter 400 of FIG. 4 will therefore place 3 zeros at an $f_{SS}$, about 53 Hz. A Hogenauer filter like the Sinc³ filter 400 in FIG. 4 cannot separate the third order zeros at the $f_{SS}$. The modifications necessary to introduce zeros at different frequencies will be described in detail in the following paragraphs.

Figure 5A:
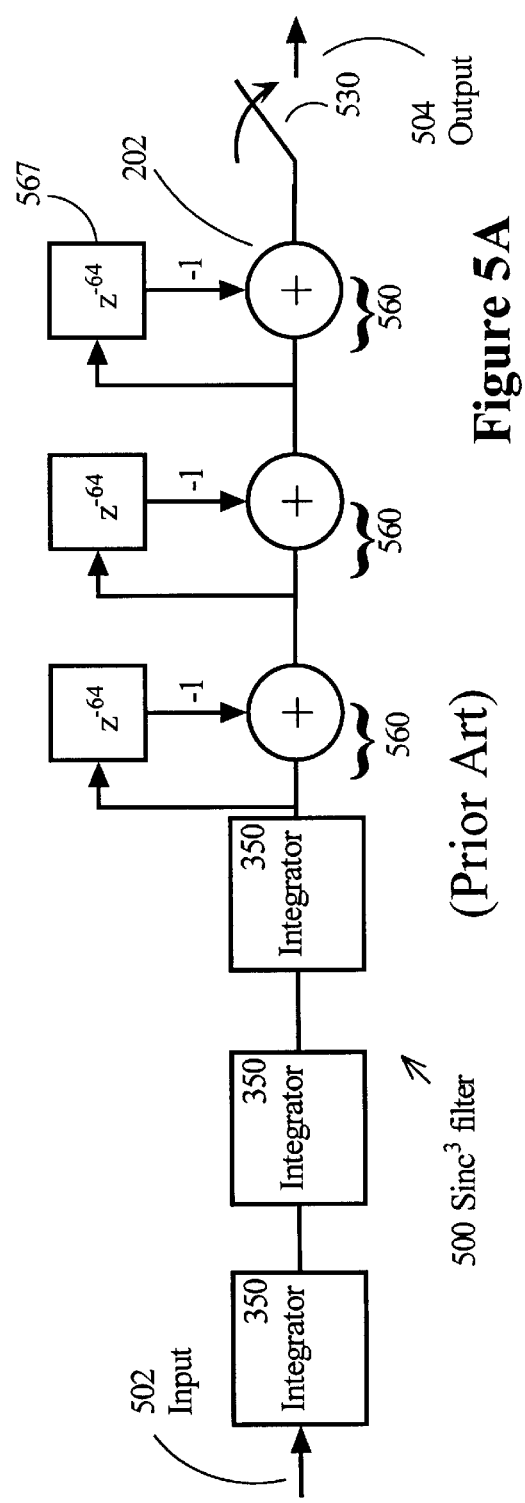
FIG. 5A is a block diagram of a Sinc³ filter at R=64 and with multiple zeros at the same frequency with R=64.

Consider the filter of FIG. 5A. It is not a Hogenauer filter; the decimator 530 is placed after the comb stages 560. This is also a third order filter designated Sinc³ filter 500. It has an input at an input terminal 502 and output at an output terminal 504. Each of the three integrator stages is composed of the k-bit integrator 350 of FIG. 3. Assume for this example that the integrator rate change factor, R, is "64" and M is "1." Because the decimator 530 is after the comb stages, the delay elements 567 must introduce a 64-cycle delay represented by the expression $z^{-64}$. Note that the multiply by −1 in the comb stages is represented by the factor −1 on the arrow connecting the delay element to the adder 202. This represents the function of the multiply by −1 element (not shown). This filter has the same response as a Hogenauer filter using a single cycle delay and a decimator switch disposed between the integrator stages and the comb stages, where the switch is closed once on the 64$^{th}$ cycle of the sampling frequency $f_S$. This filter has 3 roots at the $f_{SS}$ of $f_S/64$.

Figure 5B:
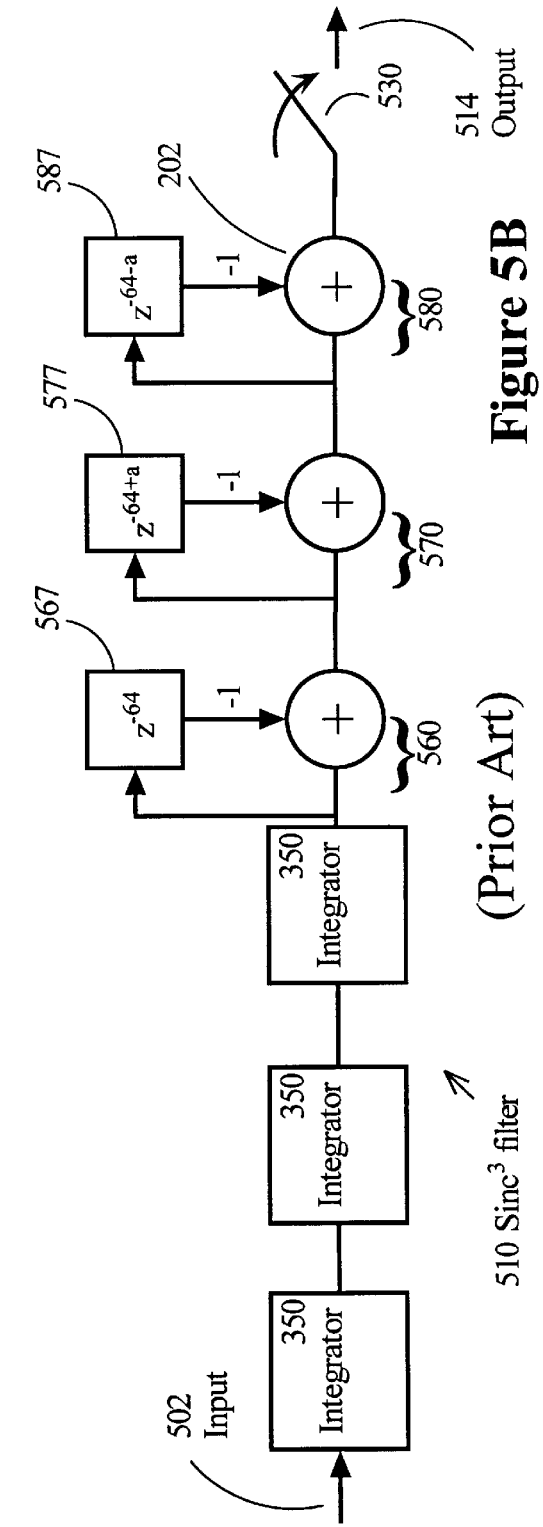
FIG. 5B is a block diagram of a modified Sinc³ filter at R=64 with spread zeros according to one embodiment of the present invention.

FIG. 5B illustrates a filter 510 that is a modification of the filter 500 of FIG. 5A, and that introduces a root at $f_S/(64-a)$ and another root at $f_S/(64+a)$, where a is a delay offset. In frequency, the new roots are at fs+α and fs−β, respectively, where α and β are frequency offsets. This is done by using a multiple-time-step delay element 577 with the z transform characteristic $z^{-64+a}$ in comb 570 and introducing a multiple-time-step delay element 587 with the z transform property $z^{-64-a}$ in comb 580.

Figure 5C:
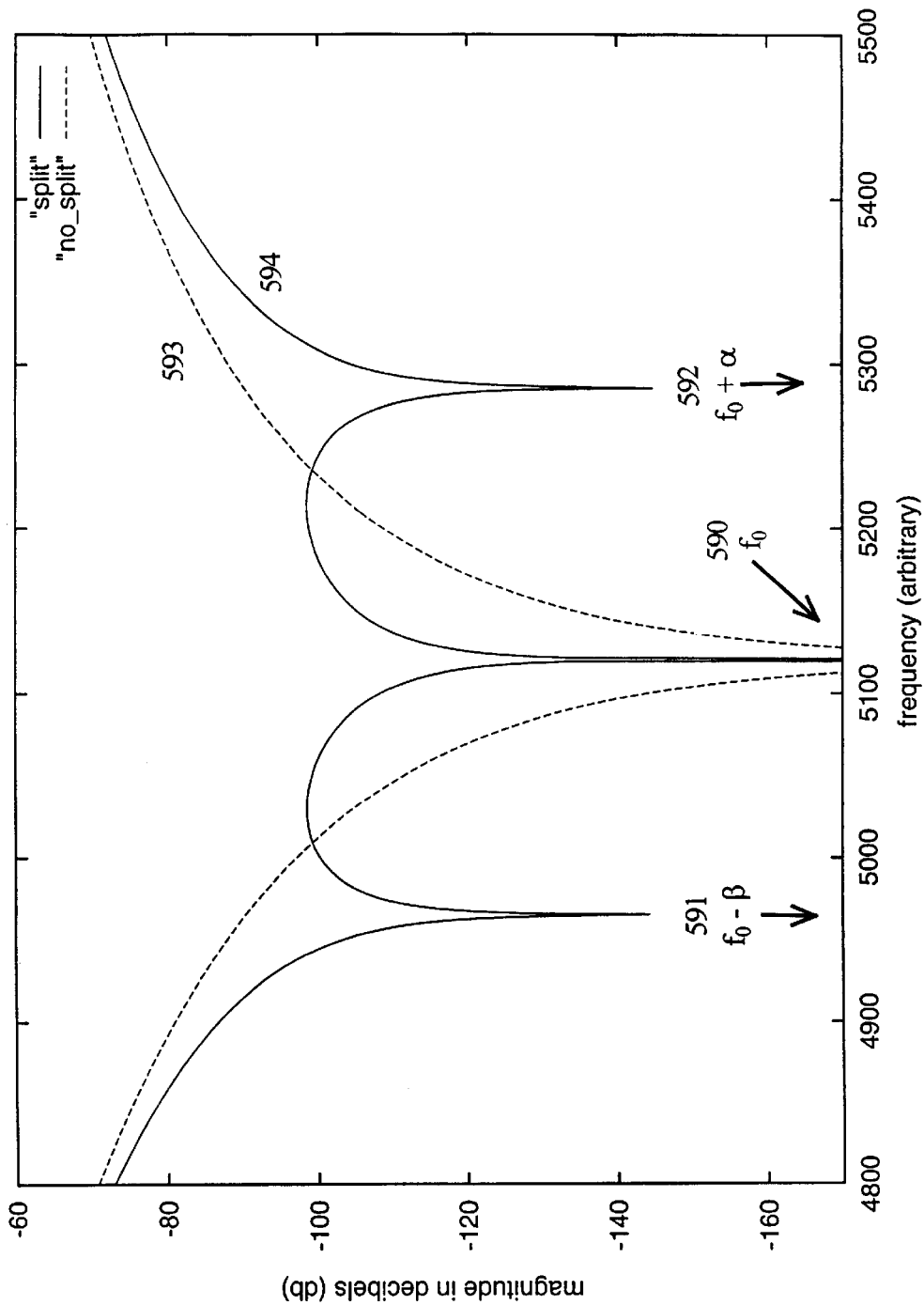
FIG. 5C is a transfer function with three spread zeros such as produced by the modified filter in FIG. 5B.

The system response of the Sinc³ filter 510 of FIG. 5B is illustrated schematically in FIG. 5C. In this schematic diagram, the system response of the original filter 500 in FIG. 5A is represented by the dashed line 593 which decreases in magnitude substantially at frequency $f_0$ (590) which represents the frequency of original multiple roots. The response of the Sinc³ filter 510 of FIG. 5B is given by the solid line 594 which has a root at $f_0$, the original root, and also has a second root at a second frequency $f_0-\beta$ (591) and a third root at a third frequency $f_0+\alpha$ (592). Associated with all these roots are substantially reduced magnitudes in the frequency response curve 594. In such a curve, the power is related to the area under the curve. For most noise spectra, such as the noise spectrum associated with delta-sigma modulator 120 and white noise, in this band of frequencies near $f_0$ all the power is associated with unwanted signals, i.e., noise. For such noise, it is mathematically verifiable that the noise is substantially less for filter 510, with a response curve 594 having three split zeros, than for filter 500, with a response curve 593, having three zeros at the same frequency. Since the noise power is reduced in the filter 510, with the split zeros, the signal to noise ratio is improved by splitting out the zeros.

Though the filter 510 of FIG. 5B improves the signal-to-noise ratio, the implementation depicted requires significant register storage to implement. Specifically, the implementation illustrated in FIG. 5B requires three chains averaging 64 registers for each chain in the comb section. Thus, a filter designer appears confronted with a dilemma requiring the designer to choose between the Hogenauer $Sinc^3$ filter 400 of FIG. 4, which does not split zeros but requires very few registers to implement, and the $Sinc^3$ filter 510 of FIG. 5B, which splits out two additional zeros but requires many more registers and therefore much more real estate on a silicon chip. The present invention, inter alia, provides a technique to split zeros without using the large amount of storage required in other filters.

Filter Design Method

Figure 6A:
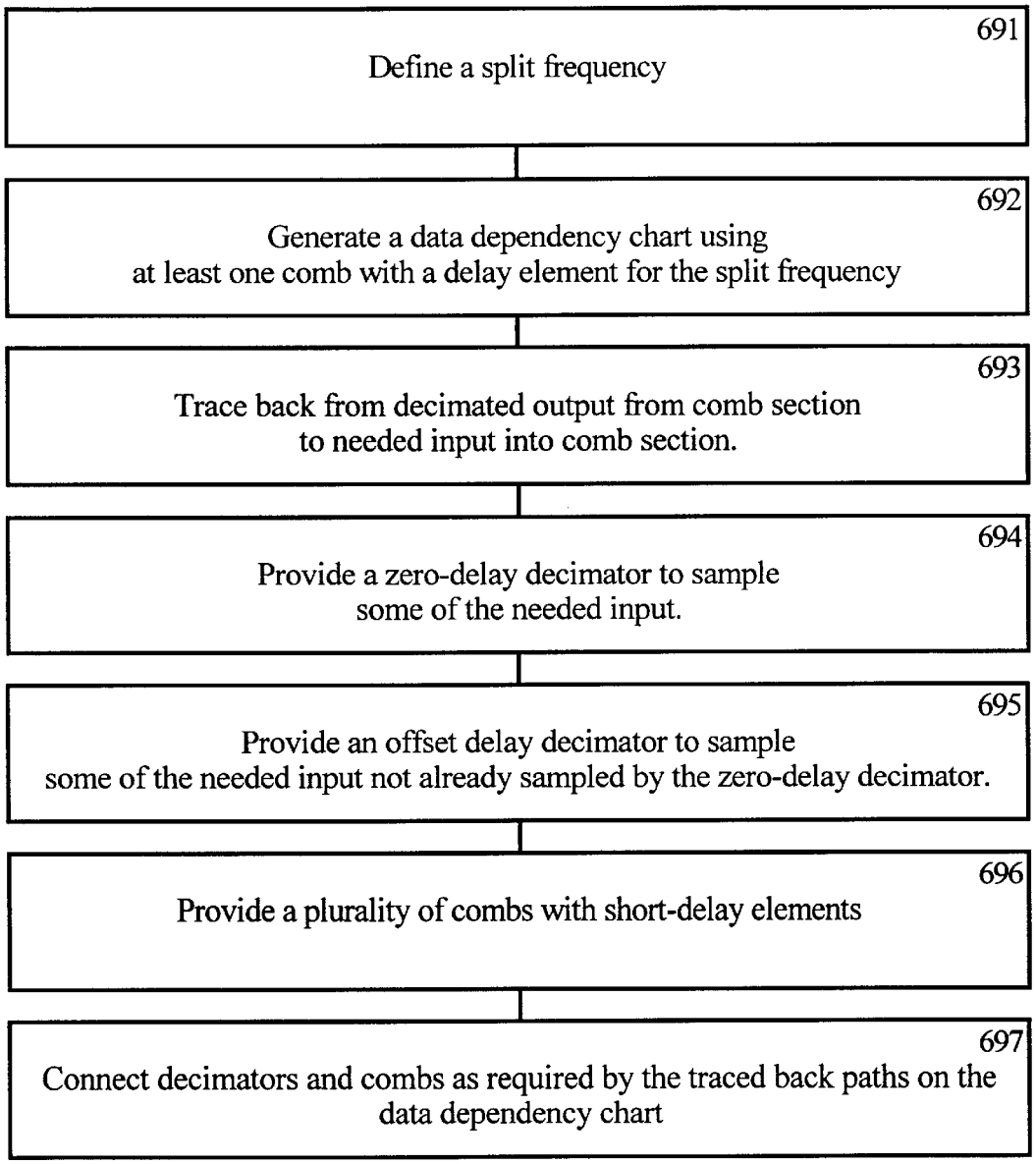
FIG. 6A is flow chart of a method for designing a digital filter with spread zeros according to one embodiment of the present invention.

According to one embodiment of the present invention, a baseline filter with N stages of integrators followed by N stages of combs followed by a decimator is used as a base for designing a digital filter with a minimal number of registers and split zeros. FIG. 6A is a flow chart of the design method according to one embodiment. A split frequency which is offset from an output frequency is defined (step 691) and simulated using the baseline. The combs of this baseline filter may be assigned different delays. At least one delay assignment is related to the split frequency desired for a split zero. A data dependency chart is generated mapping each input from the integrator section into an output from a comb section of the baseline filter (step 692). Then, for the sub-sample of outputs a trace back is started to identify the subset of inputs to the comb section that contributed to the decimated outputs, recording, as needed, the delays imposed along each trace between each comb stage in step 693. In general, the subset of inputs will not be confined to the time steps at which the output is decimated, but will include other time steps as well. Each additional time step can be associated with a different sequence of samples separated by a constant period, including the same period of the output samples, but displaced in time from the output samples.

The new filter is designed to include between the integrator section and the comb section a set of decimators in parallel, each sampling the output from the integrator section (herein also called the input to the comb section, or, simply, input) at different offsets in time. Thus the design method includes providing a decimator at the original sub-sampling frequency, $f_{SS}$ in step 694 and providing one or more decimators at times offset from the first decimator, or periods different than the first decimator, or both. The output from the parallel decimators are combined in the comb section as dictated during the tracing back step. In the embodiments described below, only single-time-step delay elements that require one register are used. In general, however, longer delays in the comb, requiring multiple registers, might also be used. The design method therefore includes a step 696 for providing a plurality of short-delay combs and a step 697 connecting the decimators to the combs with total delays equivalent to those recorded during the trace-back step.

Examples of the Design Method

The design method embodiment outlined above in general terms will become more clear to those skilled in the art by way of the following three examples.

EXAMPLE 1

The first example designs a new $Sinc^3$ filter where R is 16 and the split frequencies correspond to a sampling of 18 cycles and 14 cycles. For example, where $f_S$ is 8192 Hz, as in the sample ADC chip 100, an R of 16 yields an $f_{SS}$ of 512 Hz. The 18 cycles sampling corresponds to a frequency of about 455 Hz, (a frequency offset of −57 Hz and a time delay of two more time units), and 14 cycles sampling corresponds to a frequency of about 585 Hz (a frequency offset of +73 Hz and a delay of two fewer time units). The delays are symmetrically distributed around R, but the frequencies are not exactly symmetric. In the time domain, measured in number of sampling cycles, $f_{SS}$ corresponds to the integer factor $f_S/R$. In other embodiments the delays need not be symmetrically distributed around R. But asymmetric distribution of delays generally leads to more complex traces and usually requires that more samples be retained.

Figure 6B:
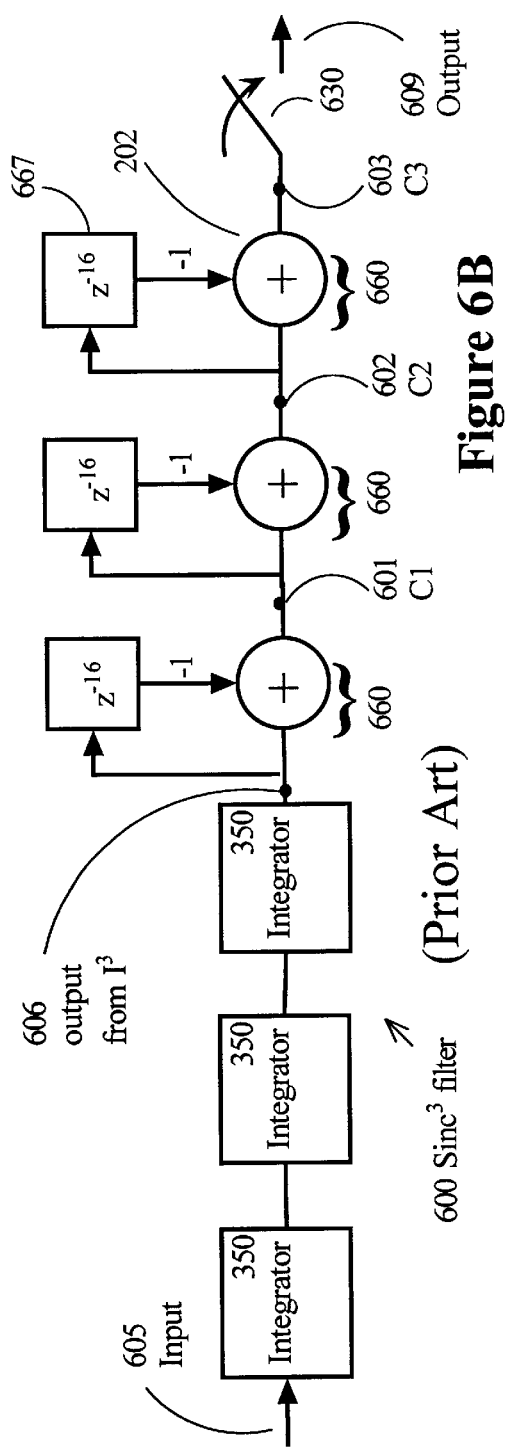
FIG. 6B is a block diagram of a Sinc³ filter having R=16 with multiple zeros at the same frequency.
Figure 6C:
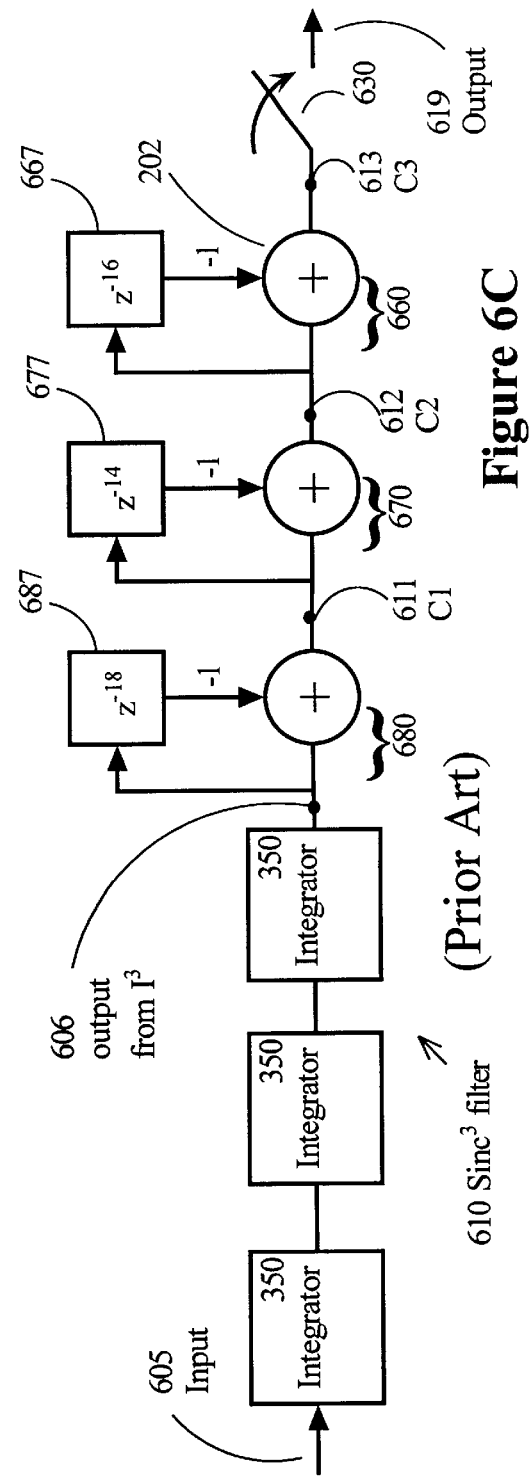
FIG. 6C is a block diagram of a baseline Sinc³ filter having R=16 with spread zeros at split frequencies.

FIGS. 6B and 6C correspond generally to FIGS. 5A and 5B, discussed above, respectively. FIG. 6B illustrates a $Sinc^3$ filter 600 with three zeros, or roots, at the $f_{SS}$ FIG. 6C illustrates a modified conventional $Sinc^3$ filter 610 which introduces two symmetric sampling delay offsets (of +/−2 cycles) corresponding to two different split zero frequencies. In this embodiment, the first comb 680 has a delay element 687 with a sampling delay of 18 cycles, the second comb 670 has a sampling delay element 677 of 14 cycles, and the third comb has a sampling delay element 667 of 16 cycles. In the data dependency chart analyzed in the following paragraphs, the input 605, and the output 606 from the three integrator stages 650 are listed in respective columns. Also listed in respective columns are the output C1 (601) from the first comb stage 660, the output C2 (602) from the second comb stage 660 and the output C3 (603) from the third comb stage 660 of the $Sinc^3$ filter 600 without split zeros. Also identified in those listings is the decimated output 609 from filter 600.

The data dependency of outputs of C1, C2 and C3 from baseline filter 600 without split zeroes and baseline filter 610 with split zeros are also shown for a few traces through the dependency charts in FIGS. 7A and 7B. It is the traces for filter 600 and 610 that are implemented in hardware to produce this embodiment of the filter. The traces for filters 600 and 610 are represented by ellipses and arrows in FIGS. 7A and 7B, respectively.

In FIG. 7A, the data dependency for filter 600 is described. The first column 792 lists the time in number of cycles of the sampling frequency $f_S$, Column 705 lists the input 605 at those times; this input corresponds to an impulse having a value "1" at a time of 1 cycles, with a value "0" at all previous and subsequent times. This input is used for illustrative purposes only; any input can be used without changing the traceback characteristics. Column 706 lists the input 606 to the comb section from the three stage integrator section (also called "output from I^3" in FIG. 7). This column 706 shows values increasing by increasing changes. Column 701 lists the output C1 from the first comb stage, column 702 lists the output C2 from the second comb stage, and column 703 lists the output C3 from the third comb stage for filter 600. The decimated output is listed in column 709. Note that the decimation rate is 16, so that a value is only output once every 16 cycles. The rows corresponding to times of decimated output are outlined with dark lines.

FIG. 7A shows that the only comb section inputs in column 706 needed for filter 600 are those synchronized with the filter output in column 719, as will be described below. The comb section inputs needed in column 706 are outlined by double walled boxes in FIG. 7A.

The first comb stage of $Sinc^3$ filter 600 combines the present time output from the previous stage, in this case, the input from column 706, with the negative of the value from 16 cycles earlier in time. For example, following the arrows, at row 739 of FIG. 7 where the time is 16 cycles, the value at C1 is the input, "136," on the same row 739 minus the input 16 cycles back on row 729 which is "0." The comb yields "136−0" which is "136," and this result is found at C1, as represented by column 701, on the same row 739. For these operations, any values at time before time 0 cycles are assumed to be 0. Thus, there is no difference between C1 and the output from $I^3$ in the first 16 rows. Ellipses surround values discussed in the example.

On the next row, when time is 17 cycles, the value in C1 is the input in column 706 on the same row minus the input value at time cycle 1 which is "1." This combination yields a value of "153–1" which is "152." This process continues to fill C1 at all subsequent times.

The next column represents the output from the second comb stage of filter 600. Arrows are used to illustrate the next combination. The relationship between the present row and the row 16 cycles earlier is analogous to the relationship shown with the arrows for the first comb stage. Looking at row 749 corresponding to time 32 cycles, the value at C2 "256" is equal to the present value at C1 "392" minus the value of C1 at time 16 cycles before, in row 739, which is "136." Therefore, the value at C2, as represented by column 702, at time 32 in row 749 equals "392–136"="256."

Similarly, each value of C3 in column 703 is the difference between the output at C2 on the same row and the output on C2 from 16 cycles earlier. Thus a value for C1, C2 and C3 can be established for all times. The C3 values are desired only at the $f_{SS}$ which is once every $16^{th}$ cycle; therefore, the output decimates the value of C3 by an R factor of 16. The decimated output occurs at rows 729, 739 and 749 outlined in bold horizontal bars. The arrows show all the combinations that contribute to the output in column 709 at time 48 cycles, in row 769.

Because the output is needed at these discreet separated times, all the intervening calculations need not be performed, and all other inputs not used in these outputs can be dropped. Here the only inputs in column 706 needed are the ones at the same times as the decimated output. Hence, it turns out that the decimation can be moved to the beginning of the comb section, i.e., after $I^3$ and before the first comb stage. The only values needed are those at time 0 cycles, 16 cycles and 32 cycles, which are found in rows 729, 739 and 749, respectively, and so on, every 16 cycles.

For the Sinc³ filter 610 of FIG. 6C, additional inputs need to be retained. This can be seen by tracing backwards from the outputs desired using the arrows in FIG. 7B. In FIG. 7B, columns 792, 705 and 706 are the same as in FIG. 7A. The outputs are still desired once very 16 cycles, as in filter 600. Comb 660 in filter 610, which provides values at C3 represented by column 713, has the same 16 cycle delay as the third stage of the filter 600, so it requires the same inputs, a value at the current output time and a value 16 cycles earlier. This is shown by the two arrows converging on the value "0" in the ellipse in column 713 at row 749. This means the output at time 48 cycles needs the output from C2 at 48 cycles and the output from C2 at 32 cycles.

Tracing backwards from the output of the second stage C2 in column 712, using the arrows, the inputs (in column 706) needed can be identified. They are marked by the double walled boxes.

The second stage, 670 of filter 610, has a delay factor of 14; and so the value in C2 depends upon the value of C1 on the same row 749 and the value on a row 758 only 14 cycles before. This dependence is shown by the two arrows connecting the ellipses with values of 423 and 252 in row 749 and the arrow connecting the oval with the value of 171 in row 758 to the oval with the value of 252 in row 749. The values inside the ellipses will be explained subsequently, when the traces are followed in the forward direction.

Now consider the values at C1 in column 711. The first stage 680 of filter 610 has a delay factor of 18; and so a value in C1 depends upon the value in column 706 on the same row and a value in a row 18 cycles earlier in time. Looking first at the ellipse containing value "423" on row 749 at time 32 cycles, the value at C1 in column 711 depends on the difference between value "528" on the same row in column 706 and the value "105" in column 706 but on the row 18 cycles before. Continuing by tracing the origins of the value for C1 required in row 758 at time 18 cycles; it can be seen to depend on the input "171" in column 706 from the same row 758 and from the row 18 cycles before, i.e., row 729 at time 0 cycles. Thus C1 on row 758 is given by "171"–"0" which is "171." Note that because of the symmetry in deviating the delays in the first and second combs, the delay offsets are the same size (2 cycles) but in opposite directions. After traversing the first two combs, the needed inputs are back in sync with the output every 16 cycles. For example, the arrows connect time 0 cycles in column 706 to time 18 cycles at C1 to time 32 cycles at C2.

For the split zero filter 610 to output a value at time 48 cycles, a C2 value is needed at time 32 cycles. Looking at the arrows, it can be seen to get a C2 value at time 32 cycles, a value is needed of C1 at 32 cycles and at 18 cycles. The value of C1 at 18 cycles requires an input from column 706 at 18 cycles and one at 0 cycles. By following all the arrows needed for the output at time 48 cycles, it can be seen that the input (col 706) to the comb section is needed at least at 0, 14, 16 18, 30, 32, 34 and 48 cycles. By continuing the tracebacks from other outputs, it can be seen that input (col 706) is needed at the output time (multiple of R) and at times 2 cycles before and 2 cycles after this time. That is, inputs (706) to the comb section are needed at times of –2, 0, 2, 14, 16, 18, 30, 32, 34 cycles, etc.

Figure 8A:
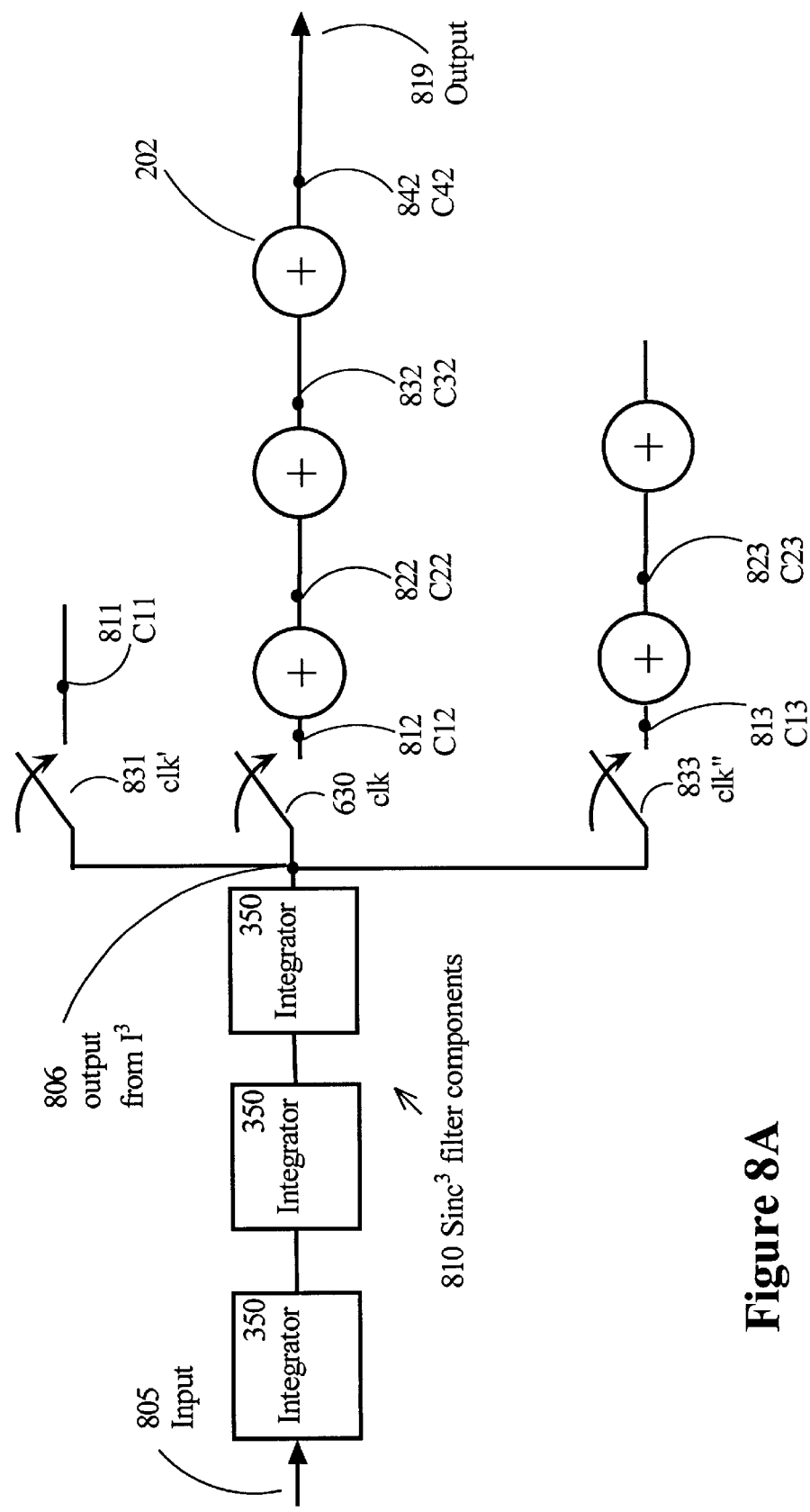
FIG. 8A is a symbolic representation of a portion of a new digital Sinc³ filter according to one embodiment of the present invention.

FIG. 8A shows components of a Sinc³ filter 810 employed to provide the needed inputs. Here the inputs to the comb section, as in previous examples, is the output 806 from a three stage integrator section ($I^3$) made up of identical integrators 350. To provide all the inputs needed by the comb section, three decimator switches, 630, 831 and 833, are included.

Figure 8B:
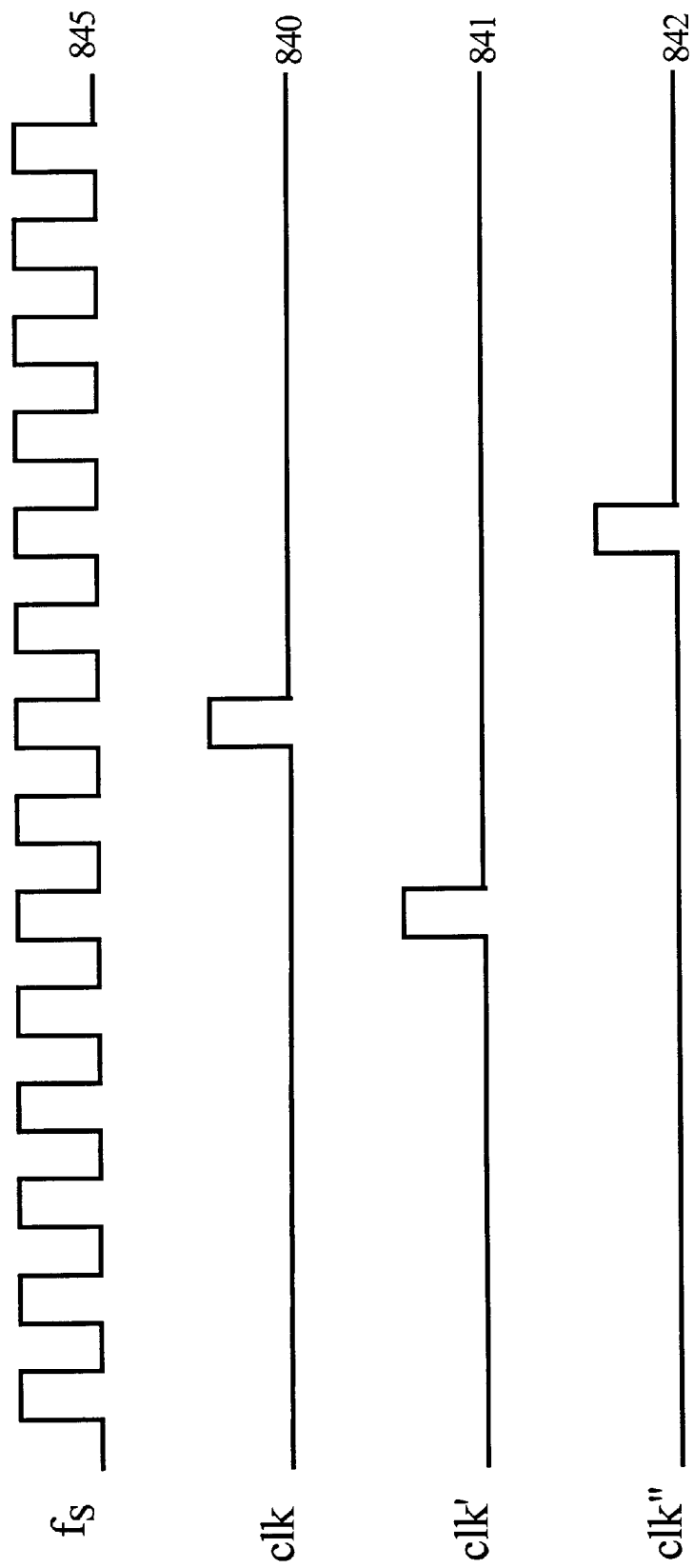
FIG. 8B is a diagram of the clock signals clk, clk', and clk" which control the decimator switches in FIG. 8A, according to this embodiment of the invention.

FIG. 8B shows the relative times, in $f_S$ cycles 845, of the three clock signals, clk, clk' and clk" of FIG. 8A. Decimator 630 samples at $f_{SS}$ in synchrony with the output desired, as in the previous embodiments, shown by the clock signal clk 840. The decimator 831 works on a different clock, signal clk' 841, which closes the switch two cycles before the sample taken by the decimator 630; and the decimator 833 takes a sample according to clock signal clk" 842 two cycles after the sample taken by the decimator 630. With this arrangement all the samples needed to compute the output from the comb stage are obtained—and only the samples required are obtained. Using this scheme the value at C11, 811 in FIG. 8A, is "105" starting at time equal 14 cycles. The value of the circuit at point C12, 812 in FIG. 8A, is 136 beginning at a time of 16 cycles. The value at the point C13, 813 in FIG. 8A, is 171 beginning at time 18 cycles. Note that in this embodiment the decimators are all working at the same interval, or period, of 16 cycles; only the instants that the switches close to take the sample occur at times that are offset from each other.

The paths established while tracing backwards from the output to identify the input to the comb stage that must be sampled, also gives the combinations required to move forward from the input from $I^3$ in column 706 to the output of the three comb stages in column 713. Until the comb stages can be completely connected, FIG. 8A represents the anticipated need for up to three comb stages on each line connected in parallel to one of the decimators. The position of the anticipated comb stages are represented temporarily only by the adders of each comb stage. Three adders are not shown for each decimator because it turns out that they will not be needed and their exclusion keeps FIG. 8A from becoming too complex.

Referring again to the data dependencies represented by the arrows in FIG. 7B, and assuming the current time is 32 cycles, it can be seen that the output of the first comb stage C1 in column 711 is the current time value from column 706, which is available from decimator 630, and the value in row 754 at time 14 cycles (which is 18 cycles earlier). The value at 14 cycles is available from the decimator 831 synchronized with time cycle 14. However, the decimator at 831 has a most recent output at time 30 cycles, two cycles before the present. Thus, the output from decimator 831 must be delayed one decimated time step (back to 30–16 cycles, which is equal to 14 cycles). Thus, C11 at 811 must be combined at the adder between points C12 and C22, 812 and 822, respectively, after a delay of one decimated step.

Figure 8C:
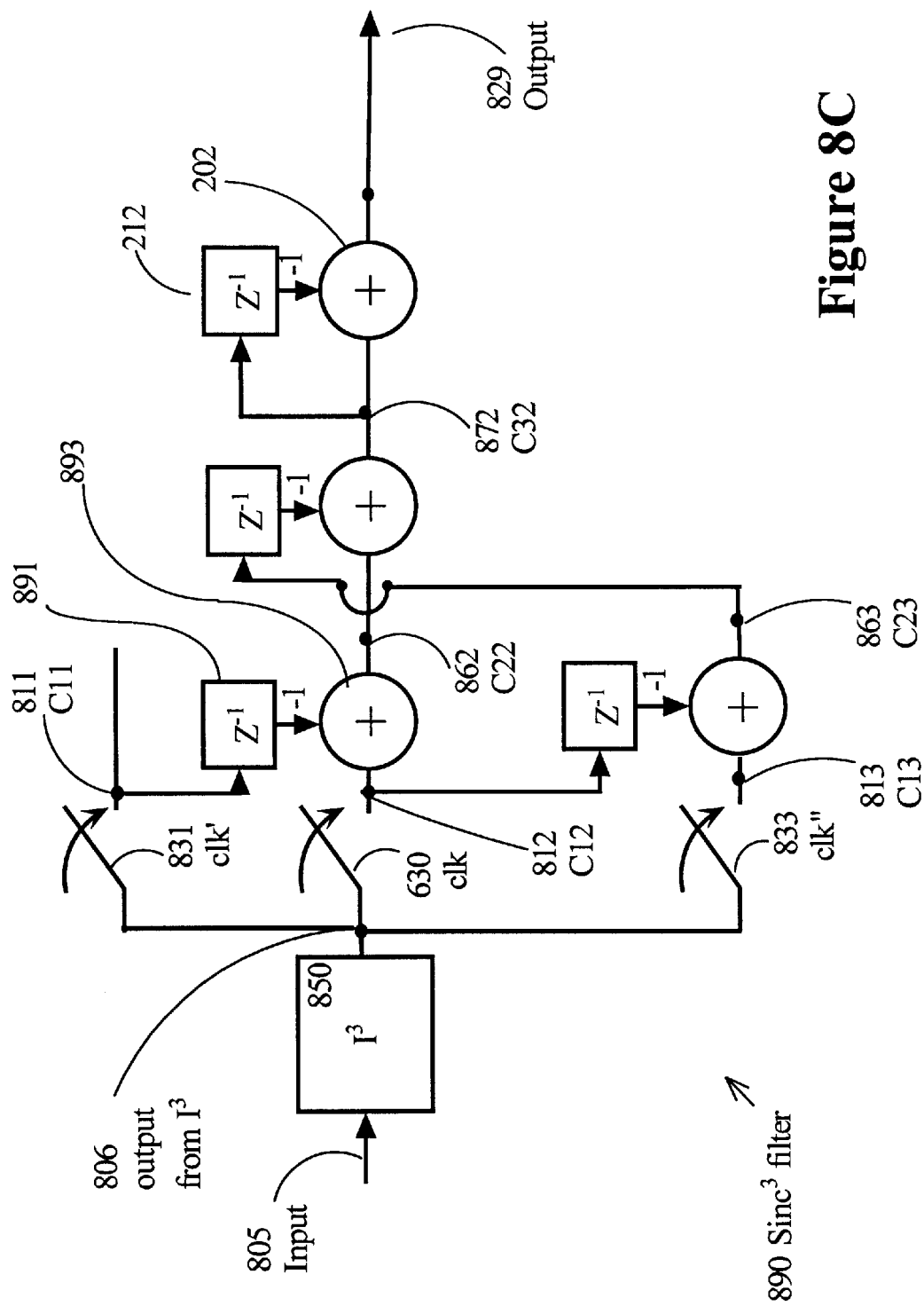
FIG. 8C is a block diagram of the complete digital Sinc³ filter of FIG. 8A according to one embodiment of the present invention.

This connection is shown as delay element 891 in FIG. 8C between points C11 (811) and the adder 893 located between C12 (812) and C22 (862).

The remainder of the connections in the circuit of FIG. 8C up to the output terminal 829 for the $Sinc^3$ filter 890 result from similarly following forward the paths through the data dependency chart established during the tracing backwards from the outputs to the inputs for the split zero filter 610. FIG. 8C depicts a new $Sinc^3$ filter 890 which has split zeros and employs much less hardware than filter 610 in FIG. 6C. Note that each signal path connecting each decimator to the output terminal encounters exactly 3 combs, where 3 is order of this filter in this embodiment. The additional hardware complexity is minor, one additional adder, one additional register and control logic for the clocks controlling the additional decimators 831 and 833. The value of the offset (a) in delay time can be easily modified. Therefore the frequency offsets ($\alpha$ and $\beta$) can be easily modified. The method can be used to move anywhere from 1 to N zeros, where N is the order of the Sinc filter. In general, the zeros can be moved to $f_{SS}-\alpha$, $f_{SS}-\beta$, and $f_{SS}-\gamma$ using time offsets of a, b and c. Note that, to keep the length of the filter unchanged, (a+b+c) should sum to zero. Since a, b and c can be chosen flexibly, so long they are integers, they need not be symmetrically distributed around the $f_{SS}$. However, moving the zeros so that the time delay offsets are not symmetric adds more complexity than the example described above. Still the paths can be traced backwards through the data dependency charts and the resulting computations and combinations transcribed to hardware in the forward direction.

The resulting hardware can be evaluated in terms of its complexity using a measure of the complexity of the comb stage. This is because the integrator stage is unchanged in all these embodiments. A Hogenauer adjusted complexity coefficient (HACK) can be defined as the number of adder and register pairs required in the implementation divided by the nominal number of adder and register pairs in a Hogenauer filter of the same order. In the example just described and illustrated in FIG. 8C, the number of adder and register pairs shown in FIG. 8C is four; and the nominal number of adder and register pairs for a third order Hogenauer filter is three. Therefore, HACK equals 1.33. For a Sinc of order N according to the present invention, HACK is less than or equal to $(2^N-1)/N$.

EXAMPLE 2

As another example of the method and resulting apparatus, a $Sinc^4$ filter is designed with simultaneous rejection of 50 Hz and 60 Hz line frequencies. A data dependency graph was developed for a baseline $Sinc^4$ filter having two zeros at one frequency (such as 50 Hz) and two zeros at another frequency (such as 60 Hz). By assuming $f_S$ is about 870 Hz and $f_{SS}$ is about 54 Hz, R is 16. If two roots are placed at a frequency corresponding to a time interval of 16+2 and two roots are placed symmetrically at a frequency corresponding to a time interval of 16–2, then the roots actually occur at frequencies of about 48 Hz and 62 Hz, respectively. (This simple example was chosen to keep the R manageably small to serve as an illustration. At a higher sampling frequency, $f_S$, and a higher value for R, such as the sample ADC chip 100 which has an $f_S$ value of 8192 Hz and an R of 153, roots can be placed closer to 50 and 60 Hz than in the simple example. Example 3 describes the case of the sample ADC.)

Figure 9:
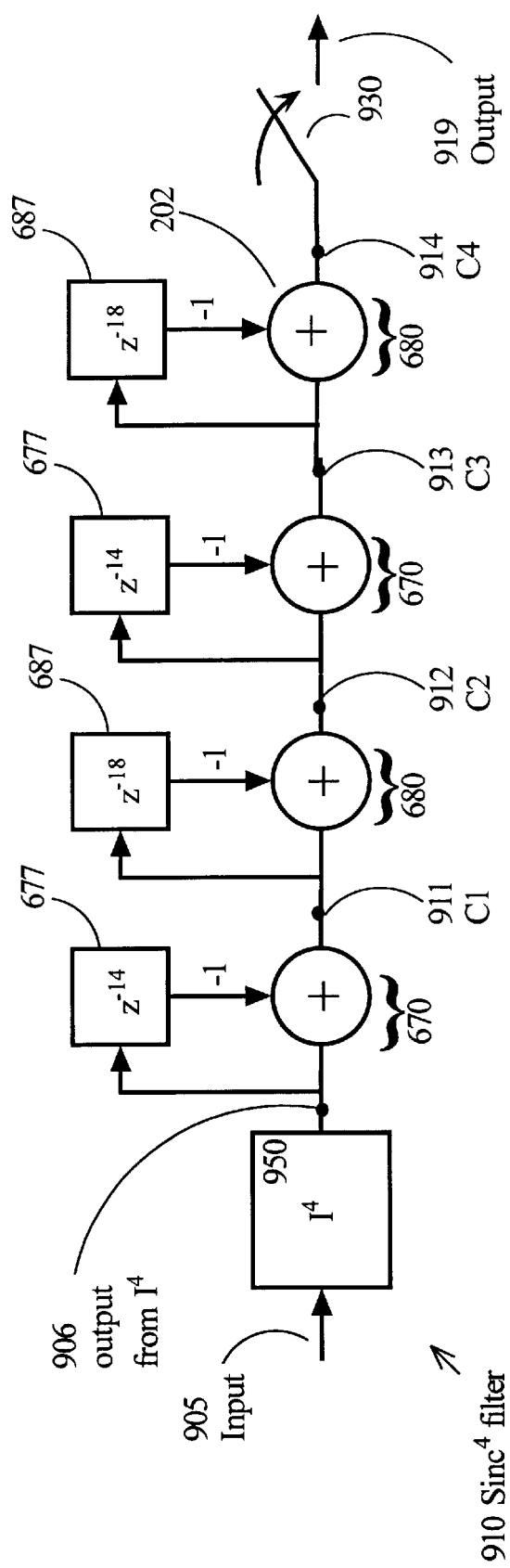
FIG. 9 is a block diagram of a baseline Sinc⁴ filter with spread zeros.

FIG. 9 illustrates the baseline filter 910 for generating the data dependency graph. Four comb stages of alternating reduced delay 677 and increased delay 687 from the R factor of 16 were connected in series with a decimator 930. This modified baseline $Sinc^4$ filter 910 produces an output 906 from four integrator stages and produces a filter output 919 after the decimator 930.

Figure 10:
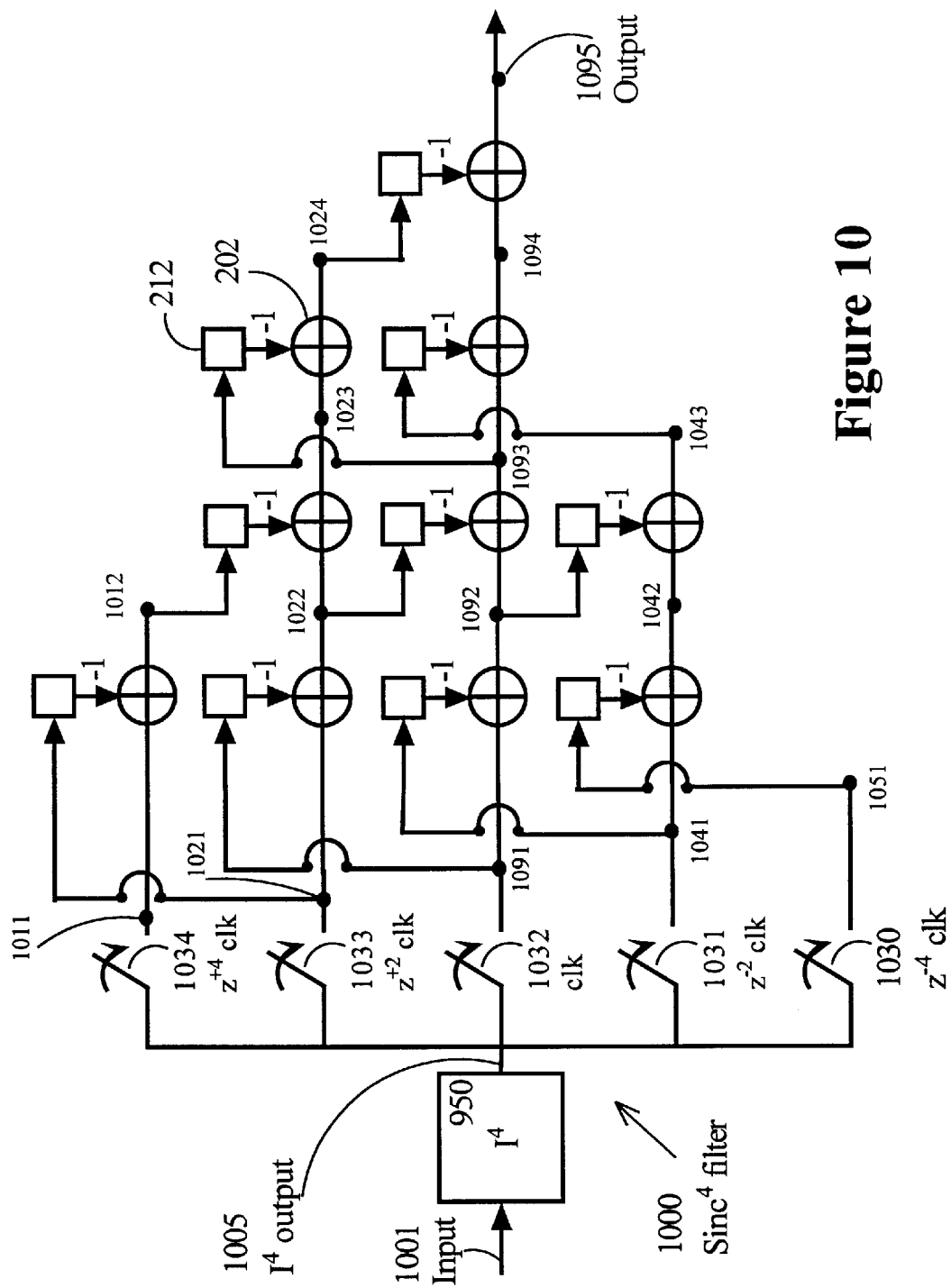
FIG. 10 is a block diagram of a new digital Sinc⁴ filter with R=16 according to another embodiment of the present invention.

FIG. 10 shows the resulting filter 1000 design. The integrator stages are represented by the $I^4$ integrator 950, and an input 1005 from the integrators is produced from an input 1001 to the filter. In this case, five different decimators 1030–1034 are required to sample all the inputs from $I^4$ 950 needed. The adders 202 are shown, as are the one-time-step delay registers 212 (also called single delay registers) connected by a multiply by –1 element indicated by the –1 adjacent to each connecting arrow. Note that the number of decimators is greater than the order of the filter. Note also that no row of combs connected to any one decimator exceeds the order of the filter. In fact each signal path connecting each decimator to the output terminal encounters exactly 4 combs, where 4 is the order of this embodiment.

The complexity of this circuit design is given by a HACK value of 10/4, i.e. 2.5. Even at 2.5 times the size of a Hogenauer filter, the $Sinc^4$ filter 1000 still represents substantial size reduction compared to the chains of 18 register delays needed in modified baseline filter 910 depicted in FIG. 9. It is also to be noted that a HACK value of 2.5 does not necessarily mean that 2.5 times as many components would be used—portions of the circuit can be easily time multiplexed. For example, in the comb section shown in FIG. 10, some, or all, of the addition operations can be time multiplexed and performed by a single adder, thus reducing the number of adders required.

EXAMPLE 3

A data dependency graph was generated for another baseline circuit (not shown) which is a $Sinc^4$ filter having four separate zeros with time delays symmetrically distributed around $f_{SS}$. The zeros for this example were $f_{SS}-\beta'$, $f_{SS}-\alpha'$, $f_{SS}+\alpha$ and $f_{SS}+\beta$, corresponding to time delays of b, a, –a and –b, respectively. In this example, $f_S$ is 8192 Hz. To achieve at least 80 dB attenuation from 47 to 63 Hz, R was 153 (for an OWR of 53.54 Hz), a was 9 cycles and b was 20 cycles. This places zeros at 47.35 Hz, 50.57 Hz, 56.89 Hz, and 61.59 Hz, much closer to the line frequencies of 50 and 60 Hz than previous examples. The resulting filter circuit 1100 is shown FIG. 11.

Figure 11:
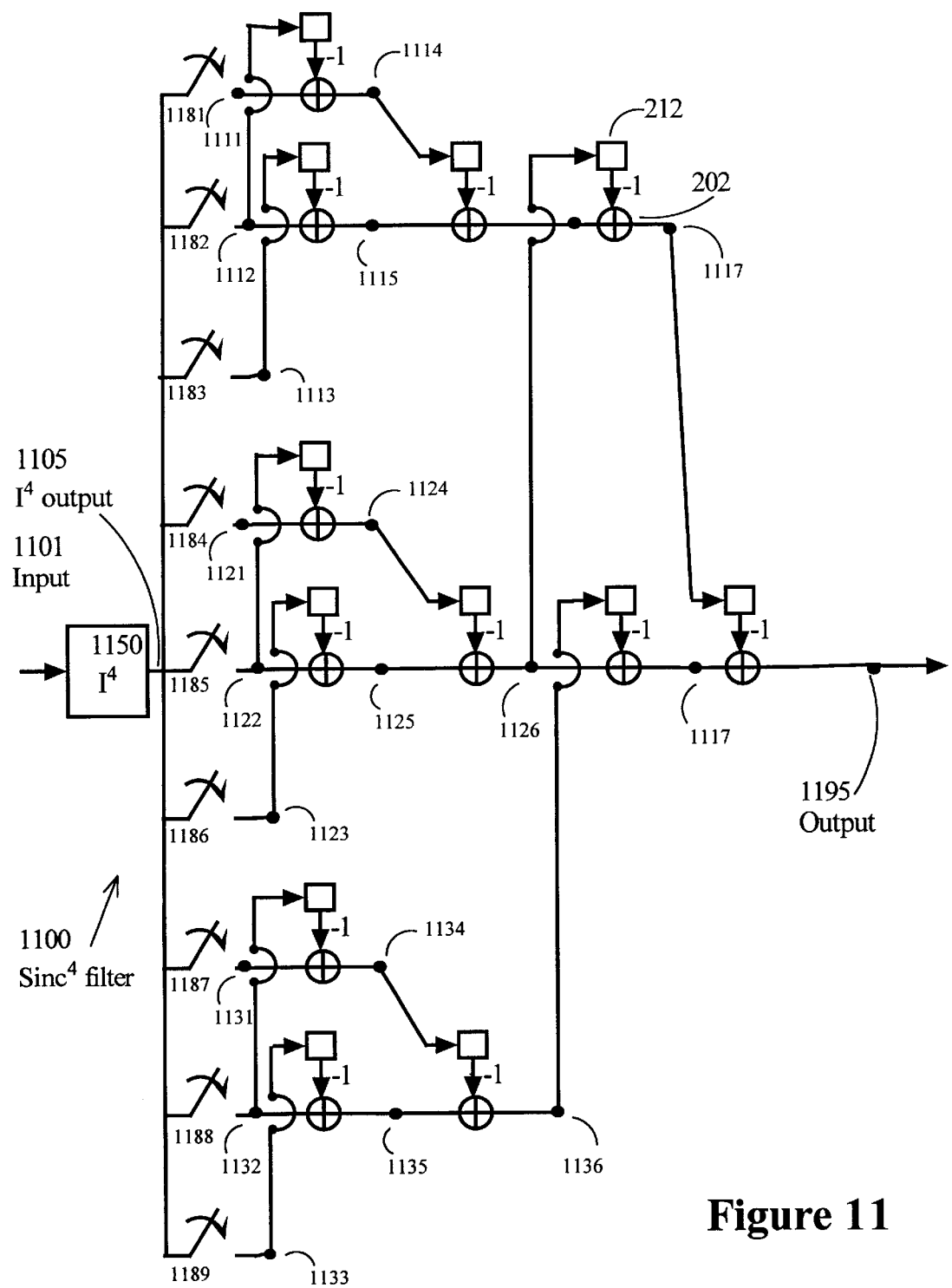
FIG. 11 is a block diagram of a new digital filter according to yet another embodiment of the present invention.

Referring to FIG. 11, it can be seen that nine decimators, 1181 to 1189, are needed to sample the input 1105 from the $I^4$ integrators 1150. Note that each decimator is connected in series to four adders or fewer. Signals from another decimator are, in some instances, incorporated by connections with a single delay register 212 associated with an adder of a different decimator. Again, every signal path connecting each decimator to the output terminal encounters exactly 4 combs, where 4 is the order of the filter.

In the case of filter 1100, the HACK value is 3 (=12/4). The $Sinc^4$ filter 1100 of FIG. 11 meets the sample ADC chip 100 specifications for at least 80 dB attenuation in the 50–60 Hz band.

The Filter Design and Related Computer Program

Figure 12:
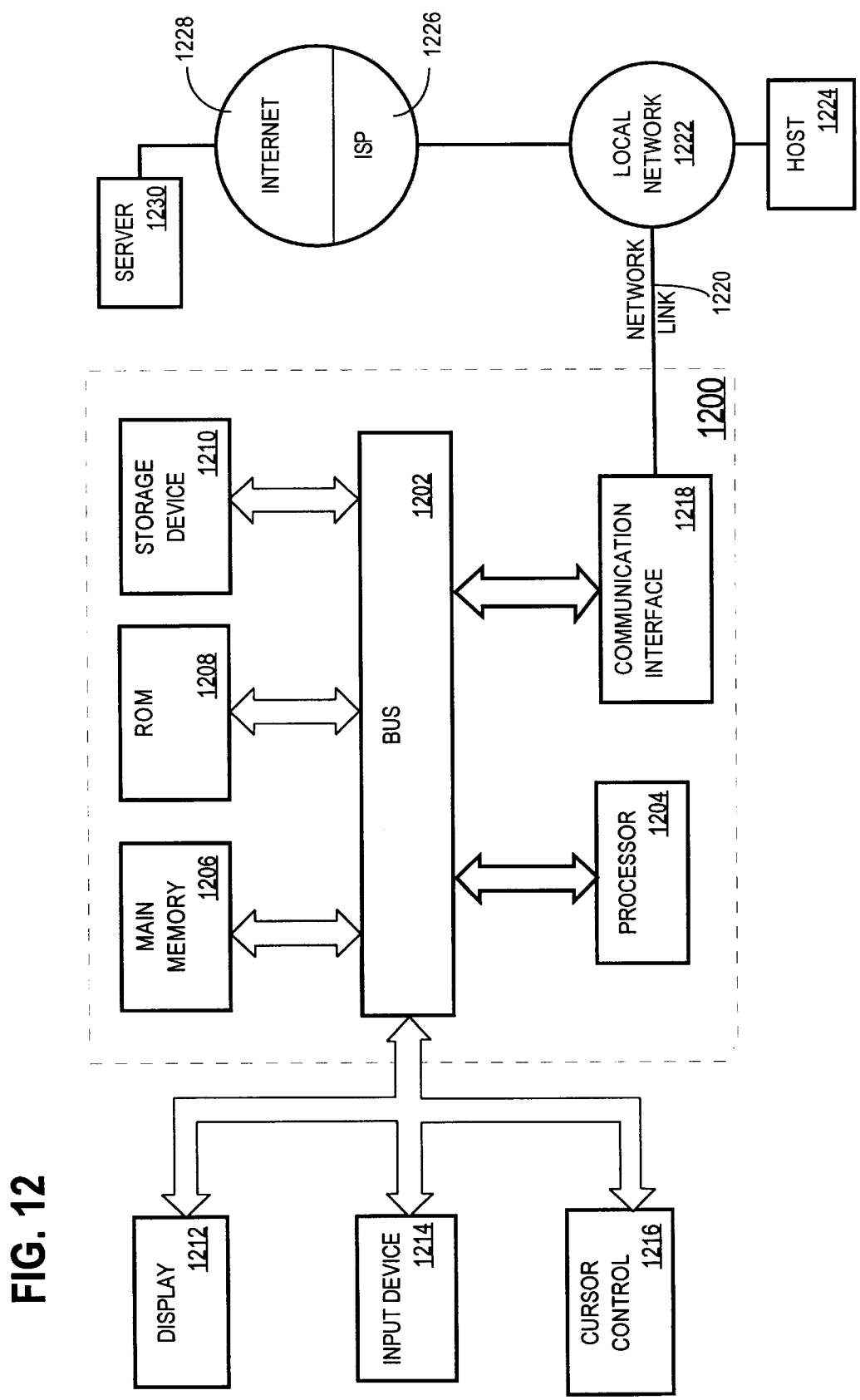
FIG. 12 is a block diagram of a computer system upon which an embodiment of the present invention may be implemented.

FIG. 12 is a block diagram that illustrates an exemplary computer system 1200 upon which filters described herein may be designed and over which programs implementing such filter designs may be transmitted. Computer system 1200 includes a bus 1202 or other communication mechanism for communicating information, and a processor 1204 coupled with bus 1202 for processing information. Computer system 1200 also includes a main memory 1206, such as a random access memory (RAM) or other dynamic storage device, coupled to bus 1202 for storing information and instructions to be executed by processor 1204. Main memory 1206 also may be used for storing temporary variables or other intermediate information during execution of instructions to be executed by processor 1204. Computer system 1200 further includes a read only memory (ROM) 1208 or other static storage device coupled to bus 1202 for storing static information and instructions for processor 1204. A storage device 1210, such as a magnetic disk or optical disk, is provided and coupled to bus 1202 for storing information and instructions.

Computer system 1200 may be coupled via bus 1202 to a display 1212, such as a cathode ray tube (CRT), for displaying information to a computer user. An input device 1214, including alphanumeric and other keys, is coupled to bus 1202 for communicating information and command selections to processor 1204. Another type of user input device is cursor control 1216, such as a mouse, a trackball, or cursor direction keys for communicating direction information and command selections to processor 1204 and for controlling cursor movement on display 1212. This input device typically has two degrees of freedom in two axes, a first axis (e.g., x) and a second axis (e.g., y), that allows the device to specify positions in a plane.

The invention is related to the use of computer system 1200 for designing digital filters with split zeros. According to one embodiment of the invention, a filter design with split zeros is provided by computer system 1200 in response to processor 1204 executing one or more sequences of one or more instructions contained in main memory 1206. Such instructions may be read into main memory 1206 from another computer-readable medium, such as storage device 1210. Execution of the sequences of instructions contained in main memory 1206 causes processor 1204 to perform the method steps described above. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 1204 for execution. Such a medium may take many forms, including but not limited to, non-volatile media, volatile media, and transmission media. Non-volatile media includes, for example, optical or magnetic disks, such as storage device 1210. Volatile media includes dynamic memory, such as main memory 1206. Transmission media includes coaxial cables, copper wire and fiber optics, including the wires that comprise bus 1202. Transmission media can also take the form of acoustic or light waves, such as those generated during radio-wave and infra-red data communications.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1204 for execution. For example, the instructions may initially be carried on a magnetic disk of a remote computer. The remote computer can load the instructions into its dynamic memory and send the instructions over a telephone line using a modem. A modem local to computer system 1200 can receive the data on the telephone line and use an infra-red transmitter to convert the data to an infra-red signal. An infra-red detector can receive the data carried in the infra-red signal and appropriate circuitry can place the data on bus 1202. Bus 1202 carries the data to main memory 1206, from which processor 1204 retrieves and executes the instructions. The instructions received by main memory 1206 may optionally be stored on storage device 1210 either before or after execution by processor 1204.

Computer system 1200 also includes a communication interface 1218 coupled to bus 1202. Communication interface 1218 provides a two-way data communication coupling to a network link 1220 that is connected to a local network 1222. For example, communication interface 1218 may be an integrated services digital network (ISDN) card or a modem to provide a data communication connection to a corresponding type of telephone line. As another example, communication interface 1218 may be a local area network (LAN) card to provide a data communication connection to a compatible LAN. Wireless links may also be implemented. In any such implementation, communication interface 1218 sends and receives electrical, electromagnetic or optical signals that carry digital data streams representing various types of information.

Network link 1220 typically provides data communication through one or more networks to other data devices. For example, network link 1220 may provide a connection through local network 1222 to a host computer 1224 or to data equipment operated by an Internet Service Provider (ISP) 1226. ISP 1226 in turn provides data communication services through the world wide packet data communication network now commonly referred to as the "Internet" 1228. Local network 1222 and Internet 1228 both use electrical, electromagnetic or optical signals that carry digital data streams. The signals through the various networks and the signals on network link 1220 and through communication interface 1218, which carry the digital data to and from computer system 1200, are exemplary forms of carrier waves transporting the information.

Computer system 1200 can send messages and receive data, including program code, through the network(s), network link 1220 and communication interface 1218. In the Internet example, a server 1230 might transmit a requested code for an application program through Internet 1228, ISP 1226, local network 1222 and communication interface 1218. In accordance with the invention, one such downloaded application provides for filter comb stage connections as described herein.

The received code may be executed by processor 1204 as it is received, and/or stored in storage device 1210, or other non-volatile storage for later execution. In this manner, computer system 1200 may obtain application code in the form of a carrier wave.

The computer program products described above can be used both to design the filter and to implement a digital signal processor. The resulting filter can be implemented in hardware using fewer registers and therefore less silicon real estate. The DSP implementation would be smaller than one used to do the same thing with a FIR as per the prior art.

CONCLUSION

In the foregoing specification, the invention has been described with reference to specific embodiments thereof. The specification and drawings are, however, to be regarded in an illustrative rather than a restrictive sense. It will be evident to one of ordinary skill in the art that various modifications and changes may be made thereto without departing from the broader spirit and scope of the invention which is defined by the appended claims and their equivalents.

What is claimed is:

1. A digital filter comprising:
    a filter input terminal;
    a first plurality of integrators, connected in series to the filter input;
    a second plurality of parallel decimators, each connected to the output of the first plurality of integrators; and
    a third plurality of combs, each comb having an adder input, a delay element input and a comb output; and
    a filter output terminal in data communication with comb outputs of the third plurality of combs,
    wherein connections among the third plurality of combs, the second plurality of parallel decimators, the first plurality of integrators and the filter output terminal are configured to provide a transfer function of a digital filter, with at least one zero spaced from an other zero, between signals on the input terminal and signals at the output terminal.

2. The digital filter of claim 1 wherein each comb has a delay element connected to the delay element input, an adder connected to the adder input, and a multiply by −1 between the delay element and the adder.

3. The digital filter of claim 2 wherein an integer number of delay cycles of the delay element is less than an integer rate change factor R.

4. The digital filter of claim 1, wherein at least one decimator of the second plurality of parallel decimators is connected to a delay element input of a particular comb of the third plurality of combs and at least another decimator of the second plurality of parallel decimators is connected to an adder input of the particular comb.

5. The digital filter of claim 1 wherein a decimation time of a first decimator of the second plurality of parallel decimators is different than a decimation time of a second decimator of the second plurality of parallel decimators.

6. The digital filter of claim 5 wherein a decimation interval of the first decimator is the same as a decimation interval of the second decimator.

7. The digital filter of claim 1 wherein:
    the transfer function is of order N;
    N is greater than 1;
    a number of the first plurality of integrators is equal to N; and
    every signal path from a decimator of the second plurality of decimators to the filter output encounters no more than N combs.

8. The digital filter of claim 7 wherein every signal path from a decimator of the second plurality of decimators to the filter output encounters exactly N combs.

9. The digital filter of claim 7 wherein the transfer function has less than N zeros superposed at any frequency.

10. The digital filter of claim 7 wherein:
    the transfer function has less than a certain number of zeros at any frequency; and
    the certain number is in a range from 2 to N.

11. The digital filter of claim 1 wherein:
    the transfer function has one zero substantially at one power line frequency, and another zero substantially at another power line frequency.

12. A method for manufacturing a digital filter, the method comprising:
    providing for a zero-delay decimator sampling an input series at a time of a sub-sample of an output series, the sub-sample of the output series corresponding to an output frequency;
    providing for an offset decimator sampling the input series at times not sampled by the zero-delay decimator;
    providing for a plurality of single-delay combs, each single-delay comb having a single delay element; and
    connecting the zero-delay decimator to an adder of at least one single-delay comb of the second plurality of single delay combs, and
    connecting the offset decimator to a single-delay element of at least one of the second plurality of single-delay combs,
    wherein the offset decimator is connected to the input series in parallel with the zero-delay decimator, and the filter has a zero at a split frequency different than the output frequency.

13. An analog to digital conversion chip comprising:
    an analog input;
    a modulator connected to the analog input to convert analog voltages to a stream of digital bits on a modulator output
    a digital filter connected to the modulator output, the filter configured to provide a particular transfer function for the stream of digital bits;
    a communications bus connected to the digital filter and the modulator;
    a clock generator connected to the communications bus;
    output control logic connected to the communications bus;
    wherein the digital filter includes
        a filter input terminal connected to the modulator output,
        a first plurality of integrators, connected in series to the filter input,
        a second plurality of parallel decimators, each connected to the output of the first plurality of integrators, a third plurality of combs, each comb having an adder input, a delay element input and a comb output, and a filter output terminal in data communication with the second plurality of parallel decimators and comb outputs of the third plurality of combs; and wherein connections among the third plurality of combs, the second plurality of parallel decimators and the filter output terminal are configured to provide the particular transfer function.

14. A digital filter comprising:

an integrator section;

a decimator connected to the output of the integrator section; and a comb section connected to the decimator, wherein a transfer function of the filter has split zeros.

15. A digital filter comprising:

a comb section;

a decimator connected to the comb section; and an integrator section connected to the decimator, wherein a transfer function of the filter has split zeros.

* * * * *